United States Patent
Suga et al.

(10) Patent No.: US 12,384,132 B2
(45) Date of Patent: Aug. 12, 2025

(54) RETARDATION FILM AND METHOD FOR PRODUCING SAME

(71) Applicant: OSAKA GAS CHEMICALS CO., LTD., Osaka (JP)

(72) Inventors: Shogo Suga, Osaka (JP); Yoshiya Ota, Osaka (JP); Yasuhiro Suda, Osaka (JP)

(73) Assignee: OSAKA GAS CHEMICALS CO., LTD., Osaka (JP)

(*) Notice: Subject to any disclaimer, the term of this patent is extended or adjusted under 35 U.S.C. 154(b) by 0 days.

(21) Appl. No.: 18/713,151

(22) PCT Filed: Nov. 18, 2022

(86) PCT No.: PCT/JP2022/042837
§ 371 (c)(1),
(2) Date: May 23, 2024

(87) PCT Pub. No.: WO2023/095722
PCT Pub. Date: Jun. 1, 2023

(65) Prior Publication Data
US 2025/0001726 A1    Jan. 2, 2025

(30) Foreign Application Priority Data
Nov. 26, 2021  (JP) .................................. 2021-191694

(51) Int. Cl.
*B32B 7/023* (2019.01)
*B32B 27/08* (2006.01)
(Continued)

(52) U.S. Cl.
CPC .............. *B32B 7/023* (2019.01); *B32B 27/08* (2013.01); *B32B 27/34* (2013.01); *B32B 27/36* (2013.01);
(Continued)

(58) Field of Classification Search
CPC .................. G02B 5/305; G02B 5/3083; B32B 7/00–7/14; B32B 27/34; B32B 27/36–27/365; C08G 63/00–63/918
See application file for complete search history.

(56) References Cited

U.S. PATENT DOCUMENTS

2015/0293286 A1* 10/2015 Jeon ..................... G02B 5/3083
                                                 359/489.07
2020/0131309 A1*  4/2020 Uehira .................. C08G 64/04

FOREIGN PATENT DOCUMENTS

CN      106256525 A    12/2016
JP     2004-325971 A   11/2004
(Continued)

OTHER PUBLICATIONS

Machine translation of JP 2017198956. Retrieved Dec. 28, 2024.*
(Continued)

*Primary Examiner* — Prashant J Khatri
(74) *Attorney, Agent, or Firm* — Squire Patton Boggs (US) LLP

(57) ABSTRACT

A retardation film comprising: a first resin layer comprising resin A having negative intrinsic birefringence, wherein in-plane phase difference Ro(450) at an angle of incidence of 0° for light at a wavelength of 450 nm, in-plane phase difference Ro(550) at an angle of incidence of 0° for light at a wavelength of 550 nm, and in-plane phase difference Ro(650) at an angle of incidence of 0° for light at a wavelength of 650 nm meet Ro(450)>Ro(550)>Ro(650); and a second resin layer comprising resin B having positive intrinsic birefringence, wherein in-plane phase difference Ro(450) at an angle of incidence of 0° for light at a wavelength of 450 nm, in-plane phase difference Ro(550) at an angle of incidence of 0° for light at a wavelength of 550 nm, and in-plane phase difference Ro(650) at an angle of incidence of 0° for light at a wavelength of 650 nm meet
(Continued)

Ro(450)>Ro(550)>Ro(650), the retardation film having a Nz coefficient of −1.0 to 1.0, wherein in-plane phase difference Ro(450) at an angle of incidence of 0° for light at a wavelength of 450 nm, in-plane phase difference Ro(550) at an angle of incidence of 0° for light at a wavelength of 550 nm, and in-plane phase difference Ro(650) at an angle of incidence of 0° for light at a wavelength of 650 nm meet Ro(450)<Ro(550)<Ro(650).

9 Claims, 6 Drawing Sheets

(51) Int. Cl.
 B32B 27/34 (2006.01)
 B32B 27/36 (2006.01)
 G02B 5/30 (2006.01)
 G02F 1/1335 (2006.01)
 H10K 59/80 (2023.01)
(52) U.S. Cl.
 CPC ....... *G02B 5/305* (2013.01); *G02F 1/133536* (2013.01); *H10K 59/8791* (2023.02); *B32B 2250/02* (2013.01); *B32B 2250/24* (2013.01); *B32B 2307/416* (2013.01)

(56) References Cited

FOREIGN PATENT DOCUMENTS

| JP | 2010-078905 A | | 4/2010 | |
| JP | 2011-242723 A | | 12/2011 | |
| JP | 2014-228864 A | | 12/2014 | |
| JP | 2016-014794 A | | 1/2016 | |
| JP | 2017198956 A | * | 11/2017 | |
| JP | 2020-086214 A | | 6/2020 | |
| JP | 2020129109 A | * | 8/2020 | ................ C09J 7/38 |
| KR | 2017-0125826 A | | 11/2017 | |
| KR | 2019-0027838 A | | 3/2019 | |
| KR | 2020-0109190 A | | 9/2020 | |
| TW | 202124547 A | | 7/2021 | |
| WO | WO-2020036101 A1 | * | 2/2020 | ........... B29C 55/005 |
| WO | WO 2021/140927 A1 | | 7/2021 | |

OTHER PUBLICATIONS

Machine translation of JP 2020129109. Retrieved Dec. 28, 2024.*
International Search Report mailed Feb. 7, 2023, for International Application No. PCT/JP2022/042837, with English translation, 9 pages.

* cited by examiner

[Figure 1]
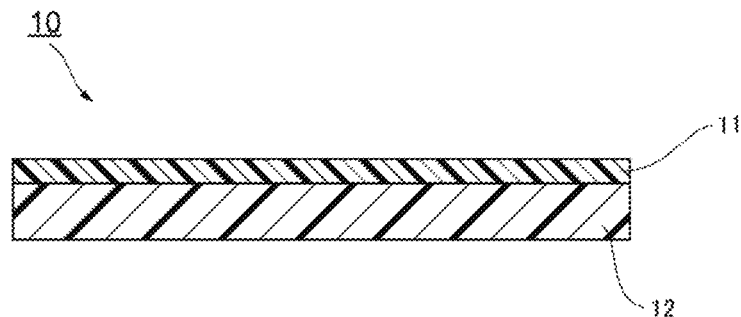
[Figure 2]
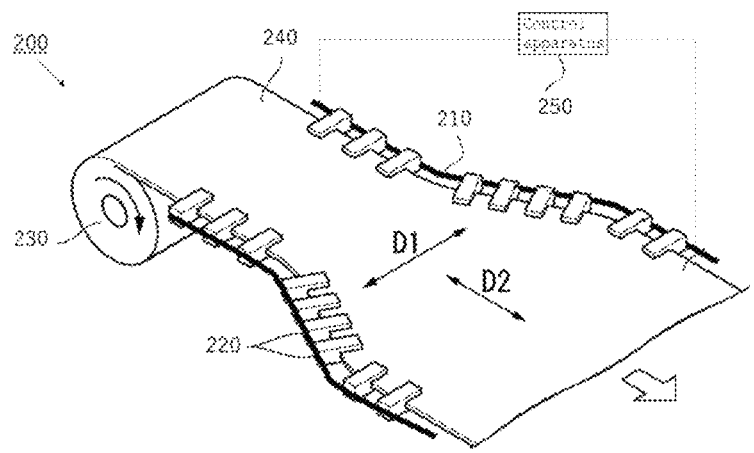
[Figure 3A]
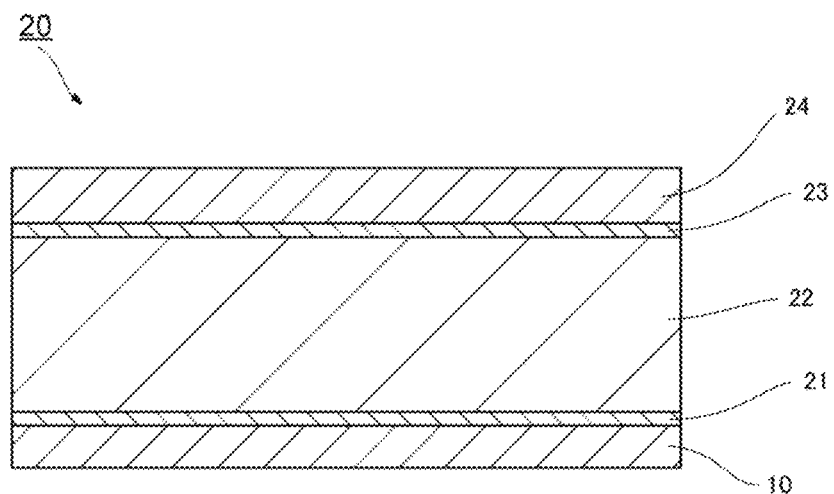

[Figure 3B]
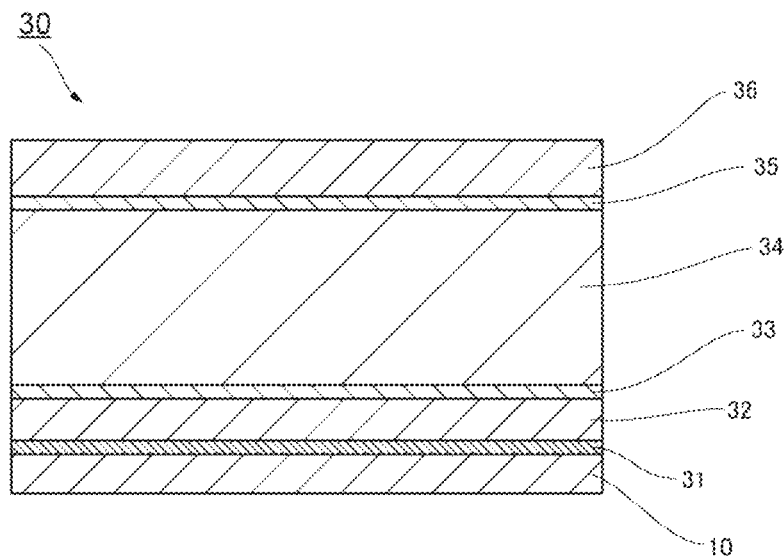
[Figure 4A]
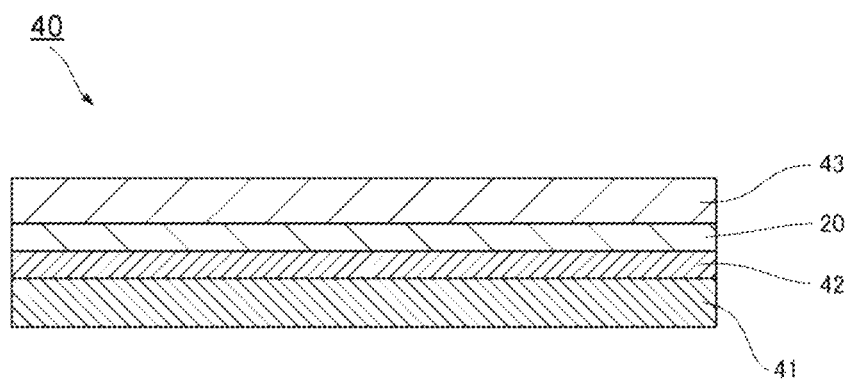

[Figure 4B]
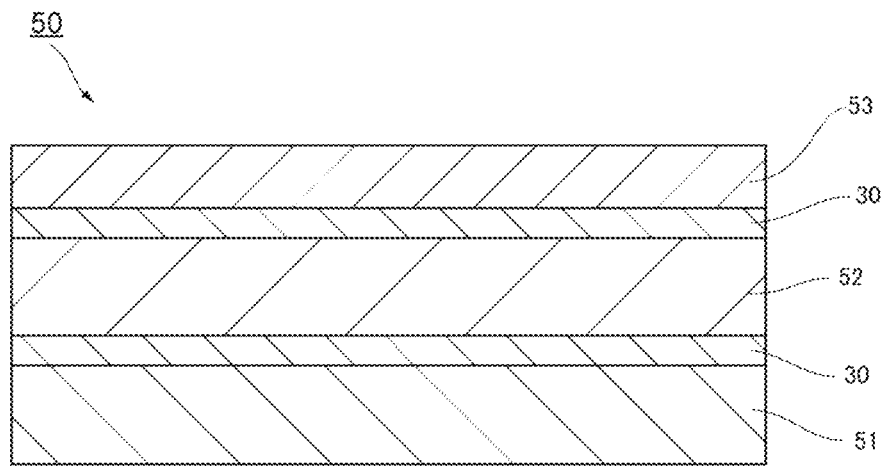
[Figure 5]
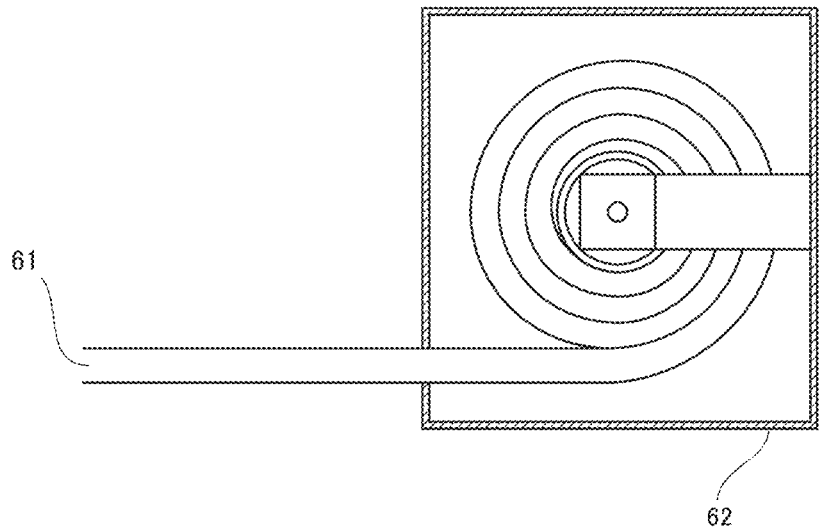

[Figure 6]
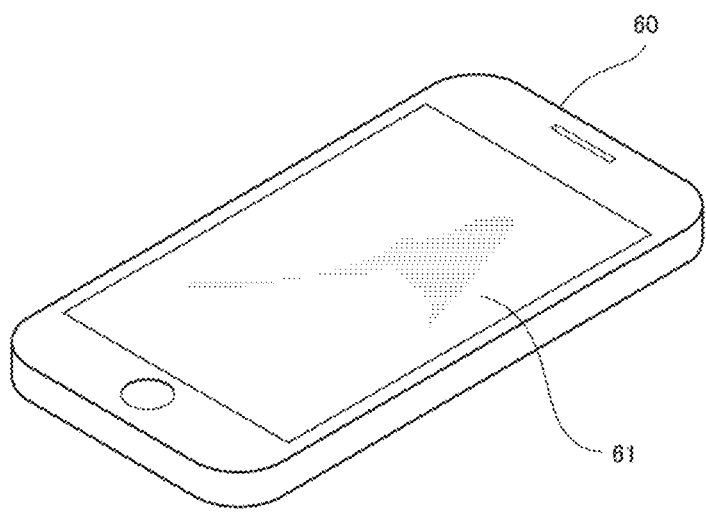

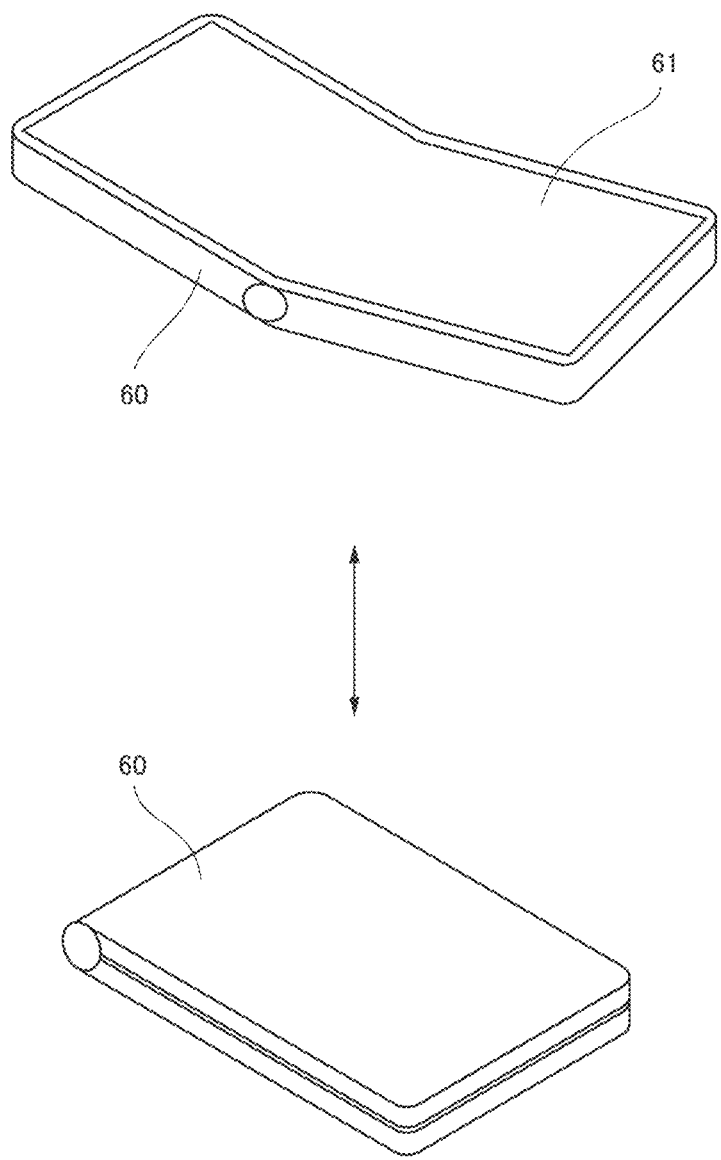
[Figure 7]

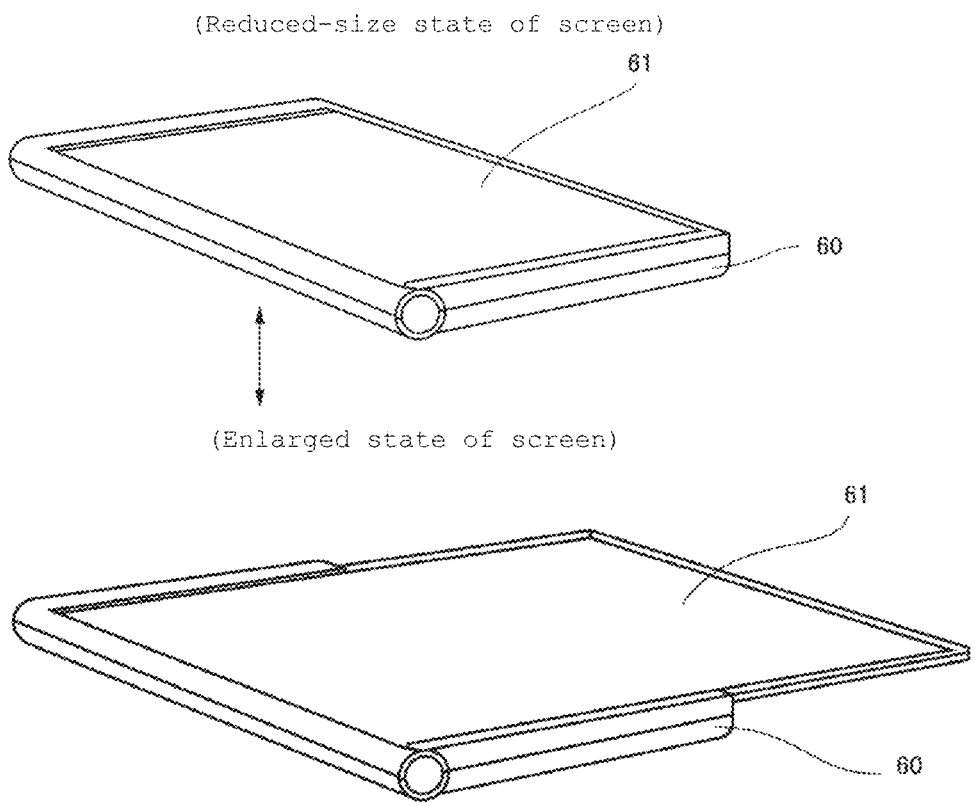
[Figure 8]

RETARDATION FILM AND METHOD FOR PRODUCING SAME

CROSS-REFERENCE

This application is a National Stage filing under 35 U.S.C. § 371 of International Patent Application No. PCT/JP2022/042837, filed Nov. 18, 2022, which claims the benefit of and priority to Japanese Patent Application No. 2021-191694, filed Nov. 26, 2021, all of these applications which are incorporated herein by reference in their entirety for all purposes.

TECHNICAL FIELD

The present invention relates to a retardation film and a method for producing the same, etc.

BACKGROUND ART

In a display apparatus such as a liquid crystal display (LCD), a retardation film is used for optical compensation that prevents reduction in contrast or color change caused by a viewing angle. In an organic EL display apparatus, unlike an LCD display apparatus, a retardation film is used for suppressing reduction in contrast caused by outside light reflection. Since such a retardation film requires optimally designing a three-dimensional refractive index depending on the purposes of these display apparatuses, a material having positive intrinsic birefringence and a material having negative intrinsic birefringence are used in combination.

For example, Patent Literature 1 discloses a phase retardation film in which a layer comprising a liquid crystal material having positive birefringence characteristics is laminated with a layer comprising a polymer material having negative birefringence characteristics, for the purpose of providing a reverse wavelength dispersion phase retardation film that is easy to adjust optical characteristics.

Patent Literature 2 discloses a laminated optical film in which a layer having a maximum refractive index in an in-plane direction is laminated with a layer having a maximum refractive index in a thickness direction, for the purpose of providing a laminated optical film having favorable wavelength dispersion when seen from a viewing angle orthogonal to a slow axis, and discloses that the layer having a maximum refractive index in an in-plane direction is a reverse dispersion layer having a combination of a resin having positive birefringence and a resin having negative birefringence.

Patent Literature 3 discloses a retardation film in which a first resin layer having an in-plane phase difference of 100 to 190 nm for light at a wavelength of 590 nm and reverse wavelength dispersibility is laminated with a second resin layer that exhibits an in-plane phase difference of 0 to 10 nm for light at a wavelength of 590 nm and positive uniaxiality or biaxiality, for the purpose of providing a retardation film that exhibits an in-plane phase difference available for λ/4 plates, also exhibits reverse wavelength dispersibility of a phase difference as to the in-plane phase difference, and has a reduced phase difference in a thickness direction. The patent literature also states that the first resin layer may have a laminated structure comprising a first film made of a resin whose intrinsic birefringence is positive, and a second film made of a resin whose intrinsic birefringence is negative.

Patent Literature 4 discloses an optical film made of a resin composition comprising a mixture of a resin whose intrinsic birefringence value is positive and a resin whose intrinsic birefringence value is negative, for the purpose of constituting a high-quality liquid crystal display screen with less change in phase difference depending on a viewing angle.

CITATION LIST

Patent Literature

Patent Literature 1: Japanese Patent Laid-Open No. 2014-228864
Patent Literature 2: Japanese Patent Laid-Open No. 2020-086214
Patent Literature 3: Japanese Patent Laid-Open No. 2011-242723
Patent Literature 4: Japanese Patent Laid-Open No. 2010-078905

SUMMARY OF INVENTION

Technical Problem

However, Patent Literature 1 is practically problematic due to a complicated production process ascribable to use of a liquid crystal material as well as large material cost. Furthermore, all of optical films described in Patent Literatures 2 to 4 can merely achieve a thickness of 80 μm or larger and thus have a challenge in thinning.

An object of the present invention is to provide a retardation film excellent in wavelength dispersibility and Nz coefficient and a method for producing the same, a polarizing plate comprising the retardation film, an image display apparatus comprising the polarizing plate, and an information processing apparatus comprising the image display apparatus.

Solution to Problem

The present inventors have conducted diligent studies to attain the object and consequently completed the present invention by finding that the object can be attained by laminating a layer having positive intrinsic birefringence with a layer having negative intrinsic birefringence so as to have predetermined optical characteristics.

Specifically, the present invention is as follows.

[1]
A retardation film comprising:
a first resin layer comprising resin A having negative intrinsic birefringence, wherein in-plane phase difference Ro(450) at an angle of incidence of 0° for light at a wavelength of 450 nm, in-plane phase difference Ro(550) at an angle of incidence of 0° for light at a wavelength of 550 nm, and in-plane phase difference Ro(650) at an angle of incidence of 0° for light at a wavelength of 650 nm meet Ro(450)>Ro(550)>Ro(650); and
a second resin layer comprising resin B having positive intrinsic birefringence, wherein in-plane phase difference Ro(450) at an angle of incidence of 0° for light at a wavelength of 450 nm, in-plane phase difference Ro(550) at an angle of incidence of 0° for light at a wavelength of 550 nm, and in-plane phase difference Ro(650) at an angle of incidence of 0° for light at a wavelength of 650 nm meet Ro(450)>Ro(550)>Ro(650), the retardation film having a Nz coefficient of −1.0 to 1.0, wherein in-plane phase difference Ro(450) at an angle of incidence of 0° for light at a wavelength of 450 nm, in-plane phase difference Ro(550) at an angle of incidence of 0° for light at a wavelength of 550 nm, and in-plane phase difference Ro(650) at an angle of incidence of 0° for light at a wavelength of 650 nm meet Ro(450)<Ro(550)<Ro(650), in-plane phase difference Ro(550) per μm in thickness of the first resin layer is 5 to 50 nm, phase difference Rth(550) in a thickness direction per μm in thickness of the first resin layer is −50 to −3 nm, in-plane phase difference Ro(550) per μm in thickness of the second resin layer is 10 to 50 nm, and phase difference Rth(550) in a thickness direction per μm in thickness of the second resin layer is 5 to 30 nm.

[2]

The retardation film according to [1], wherein the resin A has a constituent unit having a fluorene skeleton.

[3]

The retardation film according to [2], wherein the fluorene skeleton is an arylated fluorene skeleton.

[4]

The retardation film according to any one of [1] to [3], wherein the resin A comprises fluorene polyester comprising a dicarboxylic acid component represented by the following general formula (1) and at least one diol component selected from the group consisting of a diol component (A) represented by the following general formula (2), a diol component (B) represented by the following general formula (3), and a diol component (C) represented by the following general formula (4):

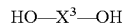
(1)

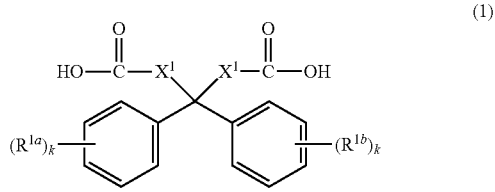

wherein R1a and R1b each independently represent a phenyl group or a naphthyl group, each k independently represents an integer of 0 to 4, and each X1 independently represents a C1-8 alkylene group,

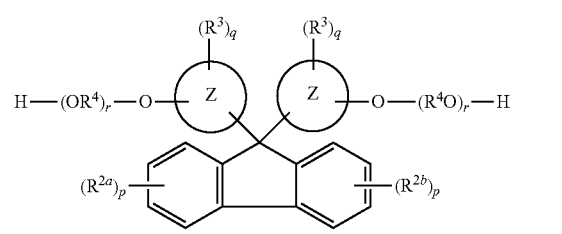
(2)

wherein each Z independently represents a phenylene group or a naphthylene group, $R^{2a}$ and $R^{2b}$ each independently represent a substituent inert to reaction, each p independently represents an integer of 0 to 4, each $R^3$ independently represents an alkyl group, an alkoxy group, a cycloalkyloxy group, an aryloxy group, an aralkyloxy group, an aryl group, a cycloalkyl group, an aralkyl group, a halogen atom, a nitro group, or a cyano group, each q independently represents an integer of 0 to 2, each $R^4$ independently represents a $C_{2-6}$ alkylene group, and each r independently represents an integer of 1 or larger,

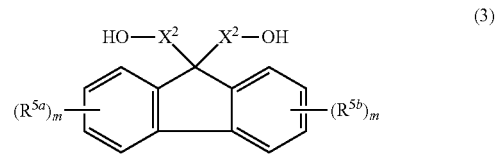
(3)

wherein $R^{5a}$ and $R^{5b}$ each independently represent a substituent inert to reaction, each m independently represents an integer of 0 to 4, and each $X^2$ independently represents a $C_{1-8}$ alkylene group,

HO—X³—OH (4)

wherein $X^3$ represents a $C_{2-8}$ alkylene group.

[5]

The retardation film according to any one of [1] to [4], wherein the resin B comprises a polyamide resin.

[6]

The retardation film according to any one of [1] to [5], wherein the retardation film is a 1/4λ retardation film.

[7]

A polarizing plate comprising the retardation film according to any one of [1] to [6].

[8]

An image display apparatus comprising the polarizing plate according to [7].

[9]

An information processing apparatus comprising the image display apparatus according to [8].

[10]

A method for producing a retardation film, comprising a drawing step of drawing an undrawn laminate to obtain a drawn laminate, the undrawn laminate having a first undrawn resin layer comprising resin A having negative intrinsic birefringence, and a second undrawn resin layer comprising resin B having positive intrinsic birefringence.

[11]

The method for producing a retardation film according to [10], wherein in the drawing step, the undrawn laminate is drawn in a direction of 45°±15° with respect to a width direction.

[12]

A drawing apparatus for a retardation film, comprising:

a pair of guide rails disposed on both terminal sides in a width direction of an undrawn laminate having a first undrawn resin layer comprising resin A having negative intrinsic birefringence, and a second undrawn resin layer comprising resin B having positive intrinsic birefringence;

grippers which move along the guide rails while gripping end parts in a width direction of the undrawn laminate so that the undrawn laminate is drawn in the width direction or in a longitudinal direction to prepare a retardation film; and a control unit which controls the grippers, wherein the control unit controls the grippers such that in the retardation film, a Nz coefficient is −1.0 to 1.0, in-plane phase difference Ro(450) at an angle of incidence of 0° for light at a wavelength of 450 nm, in-plane phase difference Ro(550) at an angle of incidence of 0° for light at a wavelength of 550 nm, and in-plane phase difference Ro(650) at an angle of incidence of 0° for light at a wavelength of 650 nm meet Ro(450)<Ro(550)<Ro(650), in-plane phase difference Ro(550) per μm in thickness of the first resin layer is 5 to 50 nm, phase difference Rth(550) in a thickness direction per μm in thickness of the first resin layer is −50 to −3 nm, in-plane phase difference Ro(550) per μm in thickness of the second resin layer is 10 to 50 nm, and phase difference Rth(550) in a thickness direction per μm in thickness of the second resin layer is 5 to 30 nm.

[13]

A retardation film manufacturing system comprising:

a lamination unit which prepares an undrawn laminate having a first undrawn resin layer comprising resin A having negative intrinsic birefringence, and a second undrawn resin layer comprising resin B having positive intrinsic birefringence; and the drawing apparatus according to.

[14]

A production system comprising a polarizing plate manufacturing line having any one or more steps selected from the step of applying a pressure-sensitive adhesive layer or an adhesive layer to the retardation film according to any one of [1] to [6], the step of laminating the pressure-sensitive adhesive layer or the adhesive layer with a polarizer, and the step of irradiating the pressure-sensitive adhesive layer or the adhesive layer with heat or active energy ray.

Advantageous Effects of Invention

The present invention can provide a retardation film excellent in wavelength dispersibility and Nz coefficient and a method for producing the same, a polarizing plate comprising the retardation film, an image display apparatus comprising the polarizing plate, and an information processing apparatus comprising the image display apparatus.

BRIEF DESCRIPTION OF DRAWINGS

FIG. 1 is a cross-sectional view schematically illustrating a retardation film according to one embodiment of the present invention.

FIG. 2 is a perspective view schematically illustrating a drawing apparatus according to one embodiment of the present invention.

FIG. 3A is a cross-sectional view schematically illustrating a polarizing plate according to one embodiment of the present invention.

FIG. 3B is a cross-sectional view schematically illustrating a polarizing plate according to another embodiment of the present invention.

FIG. 4A is a cross-sectional view schematically illustrating an image display apparatus (OLED) according to one embodiment of the present invention.

FIG. 4B is a cross-sectional view schematically illustrating an image display apparatus (LCD) according to one embodiment of the present invention.

FIG. 5 is a cross-sectional view schematically illustrating a rollable display according to one embodiment of the present invention.

FIG. 6 is a perspective view schematically illustrating an information processing apparatus according to one embodiment of the present invention.

FIG. 7 is a perspective view schematically illustrating a foldable smartphone according to one embodiment of the present invention.

FIG. 8 is a perspective view schematically illustrating a rollable smartphone according to one embodiment of the present invention.

DESCRIPTION OF EMBODIMENTS

Hereinafter, the mode for carrying out the present invention (hereinafter, referred to as the "present embodiment") will be described in detail. However, the present invention is not limited thereby, and various changes or modifications can be made in the present invention without departing from the spirit of the present invention. In the drawings, the same reference signs will be used to designate the same or similar factors, so that the overlapping description will be omitted. Positional relationships represented by terms such as "up", "down", "right", and "left" are based on the positional relationships shown in the drawings, unless otherwise specified. The dimensional ratios of the drawings are not limited to the ratios shown in the drawings.

[Retardation Film]

The retardation film of the present embodiment comprises: a first resin layer comprising resin A having negative intrinsic birefringence; and a second resin layer comprising resin B having positive intrinsic birefringence, the retardation film having a Nz coefficient of −1.0 to 1.0, wherein in-plane phase difference Ro(450) at an angle of incidence of 0° for light at a wavelength of 450 nm, in-plane phase difference Ro(550) at an angle of incidence of 0° for light at a wavelength of 550 nm, and in-plane phase difference Ro(650) at an angle of incidence of 0° for light at a wavelength of 650 nm meet Ro(450)<Ro(550)<Ro(650), in-plane phase difference Ro(550) per μm in thickness of the first resin layer is 5 to 50 nm, phase difference Rth(550) in a thickness direction per μm in thickness of the first resin layer is −50 to −3 nm, in-plane phase difference Ro(550) per μm in thickness of the second resin layer is 10 to 50 nm, and phase difference Rth(550) in a thickness direction per μm in thickness of the second resin layer is 5 to 30 nm.

FIG. 1 shows a cross-sectional view schematically illustrating the retardation film of the present embodiment. Retardation film 10 of the present embodiment has first resin layer 11 having negative intrinsic birefringence and second resin layer 12 having positive intrinsic birefringence, and these layers are laminated. Such a multilayer film can be a thin 1/4λ retardation film that exhibits reverse dispersibility as the wavelength dispersion of phase difference. Such a retardation film can have a viewing angle compensation function by lamination with a polarizing plate.

FIG. 1 illustrates a 2-layer retardation film having one first resin layer 11 and one second resin layer 12. The retardation film of the present embodiment may be constituted by 3 or more layers. The retardation film of the present embodiment may further comprise, for example, an additional layer other than the first resin layer 11 and the second resin layer 12 or may comprise two or more individual first resin layers 11 and two or more individual second resin layers 12.

1. Physical Properties 1.1. Nz Coefficient

The Nz coefficient of the retardation film is −1.0 to 1.0, preferably −0.5 to 0.8, more preferably 0 to 0.6. When the Nz coefficient falls within the range described above, a display apparatus that has less change in phase difference depending on a viewing angle and is excellent in viewability may be provided.

The Nz coefficient is a value that represents the ratio between in-plane birefringence and cross-sectional birefringence of the film, as represented by the expression given below. The Nz coefficient can be adjusted by, for example, materials for use in the first resin layer and the second resin layer, or in-plane refractive indexes of the first resin layer and the second resin layer. The Nz coefficient can be measured by a method described in Examples.

$$Nz = (nz-nx)/(ny-nx)$$

nx: the refractive index of a slow axis in an in-plane direction of a layer ny: the refractive index of a fast axis in an in-plane direction of a layer nz: the refractive index in a thickness direction of layer 1.2. Wavelength Dispersion In the whole retardation film, in-plane phase difference Ro(450) at an angle of incidence of 0° for light at a wavelength of 450 nm, in-plane phase difference Ro(550) at an angle of incidence of 0° for light at a wavelength of 550 nm, and in-plane phase difference Ro(650) at an angle of incidence of 0° for light at a wavelength of 650 nm meet Ro(450)<Ro(550)<Ro(650). Specifically, the retardation film of the present embodiment has reverse wavelength dispersibility by which the phase difference is decreased with decrease in wavelength.

The wavelength dispersion preferably satisfies 0.60<Ro(450)/Ro(550)<0.97, and more preferably satisfies 0.70<Ro(450)/Ro(550)<0.90.

The reverse wavelength dispersibility can be adjusted, for example, by suitably selecting the types of the resins used or the film in thickness ratio of each layer.

The in-plane phase difference Ro(450 nm) in the whole retardation film is preferably 10 to 200 nm, more preferably 25 to 150 nm, further preferably 50 to 125 nm.

The in-plane phase difference Ro(550 nm) in the whole retardation film is preferably 75 to 200 nm, more preferably 100 to 175 nm, further preferably 125 to 150 nm.

The in-plane phase difference Ro(650 nm) in the whole retardation film is preferably 100 to 250 nm, more preferably 125 to 225 nm, further preferably 147 to 200 nm.

1.3. Thickness

The thickness of the retardation film is preferably 1 to 50 μm, more preferably 5 to 40 μm, further preferably 10 to 35 μm.

2. First Resin Layer

The first resin layer is a layer having negative intrinsic birefringence. The first resin layer comprises resin A and may optionally comprise, for example, other additives mentioned later.

The positive intrinsic birefringence refers to the property of providing a higher refractive index in the orientation direction (direction of drawing) and means that Δn described below is positive. The negative intrinsic birefringence refers to the property of providing a higher refractive index in a direction orthogonal to the orientation direction (direction of drawing) than that in the orientation direction and means that Δn is negative. The positive intrinsic birefringence and the negative intrinsic birefringence depend on resin species.

$$\Delta n = n_{//} - n_{\perp}$$

$n_{//}$: a refractive index for light linearly polarized in the same direction as the direction of drawing $n_{\perp}$: a refractive index for light linearly polarized in a direction orthogonal to the direction of drawing 2.1. Physical Properties In the first resin layer, in-plane phase difference Ro(450) at an angle of incidence of 0° for light at a wavelength of 450 nm, in-plane phase difference Ro(550) at an angle of incidence of 0° for light at a wavelength of 550 nm, and in-plane phase difference Ro(650) at an angle of incidence of 0° for light at a wavelength of 650 nm meet Ro(450)>Ro(550)>Ro(650).

The in-plane phase difference Ro(450 nm) of the first resin layer is preferably 50 to 1000 nm, more preferably 100 to 800 nm, further preferably 125 to 600 nm.

The in-plane phase difference Ro(550 nm) of the first resin layer is preferably 50 to 900 nm, more preferably 75 to 700 nm, further preferably 97 to 500 nm.

The in-plane phase difference Ro(550 nm) per μm in thickness of the first resin layer is preferably 5 to 50 nm, more preferably 10 to 45 nm, further preferably 15 to 40 nm.

The in-plane phase difference Ro(650 nm) of the first resin layer is preferably 50 to 700 nm, more preferably 75 to 500 nm, further preferably 87 to 400 nm.

The phase difference Rth(550 nm) in a thickness direction of the first resin layer is preferably −900 to −50 nm, more preferably −700 to −75 nm, further preferably −500 to −80 nm.

The phase difference Rth(550 nm) in a thickness direction per μm in thickness of the first resin layer is preferably −50 to −3 nm, more preferably −45 to −5 nm, further preferably −40 to −7 nm.

2.2. Thickness

The thickness of the first resin layer is preferably 1 to 40 μm, more preferably 2 to 30 μm, further preferably 3 to 20 μm, still further preferably 3 to 10 μm.

2.3. Resin A

The resin A is not particularly limited as long as the resulting first resin layer has the optical physical properties described above. For example, a resin having a constituent unit comprising a fluorene skeleton is preferred. By use of the resin A having a fluorene skeleton, the orientation direction of the fluorene skeleton is orthogonal to the backbone direction (orientation direction) of the resin A. The resulting film, when drawn, produces a predetermined in-plane phase difference.

By having the fluorene skeleton, the resin A has a high refractive index in a direction orthogonal to the backbone direction of the resin A, and tends to exhibit negative intrinsic birefringence. In this context, the backbone direction of the resin A is a direction of drawing when a polymer film is drawn. The direction orthogonal thereto is a direction orthogonal to the direction of drawing.

The fluorene skeleton is preferably an arylated fluorene skeleton. In the present embodiment, the "arylation" refers to the introduction of aromatic hydrocarbon or a derivative thereof through a C—C single bond. The aromatic hydrocarbon may be, for example, a polycyclic aromatic hydrocarbon group such as a naphthyl group.

Examples of such resin A include, but are not particularly limited to, fluorene polyester and fluorene polycarbonate.

The fluorene polyester is not particularly limited and can be obtained by, for example, the polymerization of a dicarboxylic acid component having optionally arylated fluorene and an arbitrary diol component; the polymerization of an arbitrary dicarboxylic acid component and a diol component having optionally arylated fluorene; or the polymerization of a dicarboxylic acid component having optionally arylated fluorene and a diol component having optionally arylated fluorene.

The fluorene polycarbonate is not particularly limited and can be obtained by, for example, the transesterification reaction of a dicarboxylic acid component having optionally arylated fluorene and an arbitrary diol component; the transesterification reaction of an arbitrary dicarboxylic acid component and a diol component having optionally arylated fluorene; or the transesterification reaction of a dicarboxylic acid component having optionally arylated fluorene and a diol component having optionally arylated fluorene.

As long as at least any one of the dicarboxylic acid component and the diol component comprises a compound having optionally arylated fluorene, one each of the components may be used singly, or two or more each of the components may be used in combination.

The glass transition temperature of the resin A is preferably 90 to 190° C., more preferably 100 to 180° C., further preferably 110 to 170° C. When the glass transition temperature is 90° C. or higher, the heat resistance of the resin A tends to be more improved. When the glass transition temperature is 190° C. or lower, the drawability of the resin A tends to be more improved. The glass transition temperature can be measured by a method described in Examples mentioned later.

The weight-average molecular weight of the resin A is preferably 30000 to 200000, more preferably 35000 to 150000, further preferably 40000 to 100000. When the weight-average molecular weight falls within the range described above, the resin A has a long molecular chain, mechanical characteristics such as elongation at break and flexibility tend to be more improved, and drawability tends to be more improved. In the present embodiment, the weight-average molecular weight can be measured by gel permeation chromatography (GPC) based on polystyrene. More specifically, the weight-average molecular weight can be measured by, for example, a method described in Examples mentioned later.

Hereinafter, each component constituting the resin A will be described in detail.

2.3.1. Fluorene Polyester

The resin A preferably comprises fluorene polyester comprising a dicarboxylic acid component represented by the general formula (1) mentioned later and at least one diol component selected from the group consisting of a diol component (A) represented by the general formula (2), a diol component (B) represented by the general formula (3), and a diol component (C) represented by the general formula (4) mentioned later. By comprising such fluorene polyester, the resulting resin has negative intrinsic birefringence, and a property of exerting a negative phase difference tends to be more improved.

2.3.1.1. Dicarboxylic Acid Component

Examples of the dicarboxylic acid component which is a monomer constituting the fluorene polyester include, but are not particularly limited to, a compound represented by the following general formula (1):

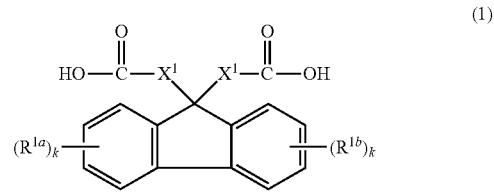

wherein $R^{1a}$ and $R^{1b}$ each independently represent a phenyl group or a naphthyl group, each k independently represents an integer of 0 to 4, and each $X^1$ independently represents a $C_{1-8}$ alkylene group.

In the general formula (1), the substitution position on the fluorene ring of the phenyl group or the naphthyl group represented by the group $R^{1a}$ or $R^{1b}$ is not particularly limited and is the 2-position or/and the 7-position in view of an industrial synthesis method of the monomer. The phenyl group has a smaller property of exerting a phase difference than that of the naphthyl group, and the naphthyl group is preferred from the viewpoint of a property of exerting a phase difference. The naphthyl group may be a 1-naphthyl group or may be a 2-naphthyl group. The 2-naphthyl group has a lager property of exerting a phase difference and is thus preferred from the viewpoint of a property of exerting a phase difference.

A mixture of a phenyl group-substituted form in which each of the groups $R^{1a}$ and $R^{1b}$ is a phenyl group and a naphthyl group-substituted form in which each of the groups $R^{1a}$ and $R^{1b}$ is a naphthyl group, which is a dicarboxylic acid component having arylated fluorene, may be used as a starting material monomer in polymerization for the fluorene polyester, or each monomer may be polymerized alone, and the resulting fluorene polyester may be mixed. Alternatively, a dicarboxylic acid component in which one of the groups $R^{1a}$ and $R^{1b}$ is a phenyl group, and the other group is a naphthyl group may be used in polymerization for the fluorene polyester. Any of these methods are effective for the purpose of adjusting a property of exerting a phase difference.

The number k of substitutions of the groups $R^{1a}$ and $R^{1b}$ may be 0, i.e., no substitution. k for both the groups is 1 or larger from the viewpoint of a property of exerting a phase difference, and fluorene is preferably substituted at both ends by aryl groups. From such a viewpoint, the number k of substitutions preferably represents an integer of 1 to 3 and more preferably represents 1. In a dicarboxylic acid component having arylated fluorene, at least one of the two k moieties is 1 or larger, and both the two k moieties are preferably 1.

A mixture of a fluorenedicarboxylic acid component in an unsubstituted form having no aryl group and a fluorenedicarboxylic acid component in a substituted form having an aryl group, which is a dicarboxylic acid component, may be used as a starting material monomer in polymerization for the fluorene polyester, or each monomer may be polymerized alone, and the resulting fluorene polyester may be mixed. Any of these methods are effective for the purpose of adjusting a property of exerting a phase difference.

In the general formula (1), examples of the $C_{1-8}$ alkylene group represented by $X^1$ can include linear or branched alkylene groups, for example, $C_{1-8}$ alkylene groups such as a methylene group, an ethylene group, a trimethylene group, a propylene group, a 2-ethylethylene group, and a 2-methylpropane-1,3-diyl group. Among them, the alkylene group is preferably a linear or branched $C_{1-6}$ alkylene group (e.g., a $C_{1-4}$ alkylene group such as a methylene group, an ethylene group, a trimethylene group, a propylene group, or a 2-methylpropane-1,3-diyl group).

Typical examples of the compound represented by the general formula (1) include, but are not particularly limited to, 9,9-bis(2-carboxyethyl)fluorene, 9,9-bis(2-carboxypropyl) fluorene, 9,9-bis(carboxy-$C_{4-6}$ alkyl) fluorene, 9,9-bis(2-carboxyethyl) 2,7-diphenylfluorene, 9,9-bis(2-carboxypropyl) 2,7-diphenylfluorene, 9,9-bis(carboxy-$C_{4-6}$ alkyl) 2,7-diphenylfluorene, 9,9-bis(2-carboxyethyl) 2,7-di(2-naphthyl) fluorene, 9,9-bis(2-carboxypropyl) 2,7-di(2-naphthyl) fluorene, 9,9-bis(carboxy-$C_{4-6}$ alkyl) 2,7-di(2-naphthyl) fluorene, 9,9-bis(2-carboxyethyl) 2,7-di(1-naphthyl) fluorene, 9,9-bis(2-carboxypropyl) 2,7-di(1-naphthyl) fluorene, and 9,9-bis(carboxy-$C_{4-6}$ alkyl) 2,7-di(1-naphthyl) fluorene. These fluorenedicarboxylic acid components may each be used singly, or two or more thereof may be combined.

Among them, the fluorenedicarboxylic acid component is preferably 9,9-bis(2-carboxyethyl)2,7-di(2-naphthyl) fluorene of the general formula (1) wherein each of $R^{1a}$ and $R^{1b}$ is a 2-naphthyl group, k is 1, and $X^1$ is an ethylene group. By use of such a dicarboxylic acid component, a property of exerting a phase difference tends to be more improved.

The dicarboxylic acid component is not only free carboxylic acid but includes ester-forming derivatives of the dicarboxylic acid, for example, ester [e.g., alkyl ester [e.g., lower alkyl ester (e.g., $C_{1-4}$ alkyl ester, particularly, $C_{1-2}$ alkyl ester) such as methyl ester or ethyl ester]], acid halide (e.g., acid chloride), and acid anhydride. These dicarboxylic acid components can each be used singly, or two or more thereof can be used in combination.

In the fluorene polyester, a dicarboxylic acid component having no fluorene ring may be used in combination with the dicarboxylic acid component represented by the general formula (1).

The ratio of a dicarboxylic acid component represented by the general formula (1) wherein k is 1 or larger among dicarboxylic acid components to be introduced to the fluorene polyester is preferably 80 to 100% by mol, more preferably 90 to 100% by mol, further preferably 95 to 100% by mol, particularly preferably 100% by mol. When the ratio of the dicarboxylic acid component represented by the general formula (1) wherein k is 1 or larger, i.e., a dicarboxylic acid component having an arylated fluorene ring, falls within the range described above, an excellent property of exerting a phase difference tends to be exerted.

2.3.1.2. Method for Producing Dicarboxylic Acid Component

A method for producing 9,9-bis(2-methoxycarbonylethyl) 2,7-di(2-naphthyl) fluorene (DNFDP-m) represented by the following general formula (8) will be described as a representative example of alkyl ester of the dicarboxylic acid component represented by the general formula (1):

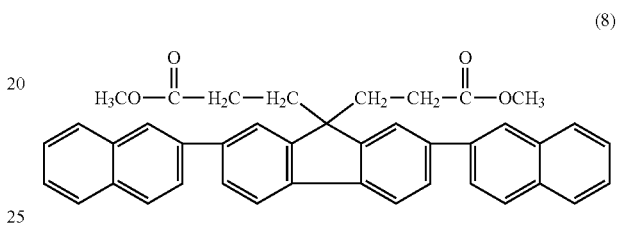

(8)

A reaction scheme (9) given below shows a synthesis route of DNFDP-m. There are a plurality of synthesis routes, and the present invention is not limited thereby.

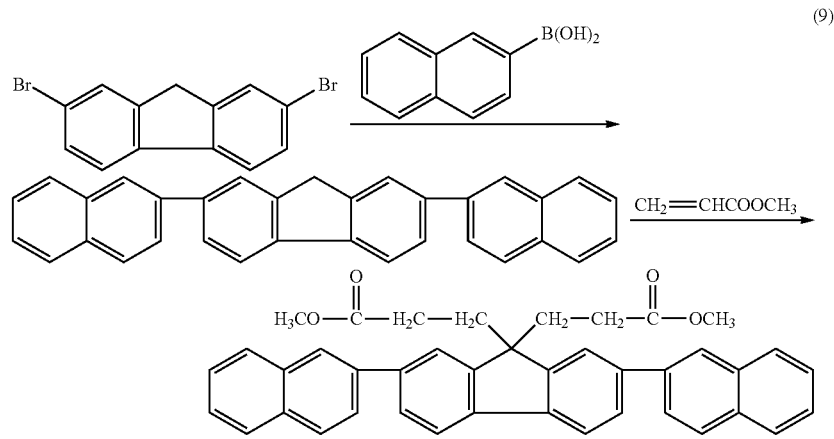

(9)

In the reaction scheme (9), 2,7-dibromofluorene is reacted (Suzuki-Miyaura cross coupling) as a starting material with 2-naphthylboronic acid to form 2,7-di(2-naphthyl) fluorene (DNF). Further, DNFDP-m is obtained through the addition reaction (Michael addition) of DNF with methyl acrylate.

The Suzuki-Miyaura cross coupling at the first stage usually involves reacting a brominated aromatic compound with an aromatic compound having a boronic acid group using a palladium catalyst in the presence of a base. Examples of the base include, but are not particularly limited to, sodium carbonate, potassium carbonate, sodium bicarbonate, sodium hydroxide, potassium hydroxide, barium hydroxide, potassium fluoride, tripotassium phosphate, and potassium acetate. Among them, usually, alkali metal carbonate such as potassium carbonate is often used. The ratio of the base used is, for example, on the order of 0.1 to 50 mol, preferably 1 to 25 mol, per mol of 2,7-dibromofluorene. In the reaction, potassium carbonate can be used.

Examples of the palladium catalyst include, but are not particularly limited to, tetrakis(triphenylphosphine) palladium(0), bis(tri-t-butylphosphine) palladium(0), [1,2-bis(diphenylphosphino)ethane]palladium(II) dichloride, [1,3-bis(diphenylphosphino)propane]palladium(II) dichloride, [1,1'-bis(diphenylphosphino)ferrocene]palladium(II) dichloride, bis(triphenylphosphine)palladium(II) dichloride, and bis(tri-o-tolylphosphine) palladium(II) dichloride. Among these catalysts, usually, tetrakis(triphenylphosphine) palladium(0) is often used. The ratio of the catalyst is, for example, on the order of 0.01 to 0.1 mol, preferably 0.03 to 0.07 mol, in terms of a metal per mol of 2,7-dibromofluorene. In the reaction, tetrakis(triphenylphosphine)palladium (0) can be used.

The coupling reaction may be performed in the presence of a solvent. In the reaction, toluene can be used as the solvent.

The reaction temperature of the coupling reaction is, for example, 50 to 200° C., preferably 60 to 100° C. In the reaction, the reaction temperature is 70 to 80° C.

After the completion of the reaction, the reaction mixture may be separated or purified, if necessary, by a common separation or purification method. In the reaction, the reaction mixture can be washed with water and then purified by crystallization.

The Michael addition reaction at the second stage is a reaction through which carbon at the 9-position of fluorene is added to the β-position of unsaturated carboxylic acid ester in the presence of a basic catalyst. Methyl acrylate is added dropwise together with a catalyst to a solution containing DNF obtained through the reaction at the first stage, dissolved in a solvent, and the reaction is performed at 50 to 60° C.

The basic catalyst is not particularly limited as long as a fluorene anion can be formed. A common inorganic base or organic base can be used. Examples of the inorganic base include metal hydroxide (e.g., alkali metal hydroxide such as lithium hydroxide, sodium hydroxide, and potassium hydroxide, and alkaline earth metal hydroxide such as calcium hydroxide and barium hydroxide).

Examples of the organic base can include metal alkoxide (alkali metal alkoxide such as sodium methoxide and sodium ethoxide) and quaternary ammonium hydroxide (e.g., tetraalkylammonium hydroxide such as tetramethylammonium hydroxide, tetraethylammonium hydroxide, and tetra-n-butylammonium hydroxide, and trimethylbenzylammonium hydroxide). The trimethylbenzylammonium hydroxide may be obtained, for example, as trade name "Triton B" (40% solution of trimethylbenzylammonium hydroxide in methanol from Tokyo Chemical Industry Co., Ltd. Triton B can be used in the synthesis of the DNFDP-m.

The Michael addition reaction may be performed in the presence of a solvent. The solvent is not particularly limited as long as the solvent is nonreactive with the catalyst and is capable of dissolving a fluorene compound. A wide range of solvents can be used. Methyl isobutyl ketone can be used as the solvent in the synthesis of the DNFDP-m.

After the completion of the reaction, the reaction mixture may be separated or purified, if necessary, by a common separation or purification method. In the reaction, the reaction mixture can be washed with water and then purified by crystallization.

2.3.1.3. Diol Component

The diol component which is a monomer constituting the fluorene polyester is not particularly limited. For example, at least one diol component selected from the group consisting of a diol component (A) represented by the general formula (2) given below, a diol component (B) represented by the general formula (3) given below, and a diol component (C) represented by the general formula (4) given below is preferably used. Hereinafter, each diol component will be described in detail.

2.3.1.3.1. Diol Component (A)

The diol component (A) which is a monomer that may constitute the fluorene polyester can be represented by the following general formula (2):

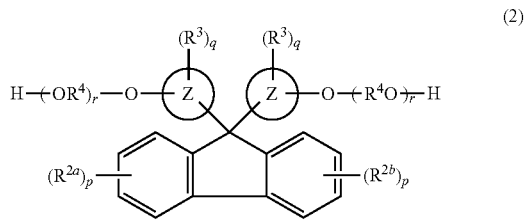

(2)

wherein each Z independently represents a phenylene group or a naphthylene group, $R^{2a}$ and $R^{2b}$ each independently represent a substituent inert to reaction, each p independently represents an integer of 0 to 4, each $R^3$ independently represents an alkyl group, an alkoxy group, a cycloalkyloxy group, an aryloxy group, an aralkyloxy group, an aryl group, a cycloalkyl group, an aralkyl group, a halogen atom, a nitro group, or a cyano group, each q independently represents an integer of 0 to 2, each $R^4$ independently represents a $C_{2-6}$ alkylene group, and each r independently represents an integer of 1 or larger.

In the general formula (2), examples of the groups $R^{2a}$ and $R^{2b}$ include, but are not particularly limited to, nonreactive substituents such as a cyano group, halogen atoms (a fluorine atom, a chlorine atom, a bromine atom, etc.), and hydrocarbon groups [e.g., alkyl groups and aryl groups ($C_{6-10}$ aryl groups such as a phenyl group)]. Each of the groups may be a halogen atom, a cyano group, or an alkyl group (particularly, an alkyl group). Examples of the alkyl group can include $C_{1-12}$ alkyl groups (e.g., $C_{1-8}$ alkyl groups, particularly, $C_{1-4}$ alkyl groups such as a methyl group) such as a methyl group, an ethyl group, a propyl group, an isopropyl group, a butyl group, and a t-butyl group. The types of the groups $R^{2a}$ and $R^{2b}$ may be the same as or different from each other. The substitution positions of the groups $R^{2a}$ and $R^{2b}$ may be, for example, the 2-position, 7-position, or the 2- and 7-positions of fluorene. The number p of substitutions may be on the order of 0 to 4 (e.g., 0 to 2) and is preferably 0 or 1, particularly, 0.

In the present embodiment, the phrase "inert to reaction" means being inert to polymerization reaction for the fluorene polyester.

In the general formula (2), examples of the substituent $R^3$ can include, but are not particularly limited to: hydrocarbon groups such as alkyl groups (e.g., $C_{1-6}$ alkyl groups such as a methyl group, an ethyl group, a propyl group, an isopropyl group, a butyl group, and a t-butyl group), cycloalkyl groups (e.g., $C_{5-8}$ cycloalkyl groups such as a cyclohexyl group), aryl groups (e.g., $C_{6-10}$ aryl groups such as a phenyl group, a tolyl group, a xylyl group, and a naphthyl group), and aralkyl groups (e.g., $C_{6-10}$ aryl-$C_{1-4}$ alkyl groups such as a benzyl group and a phenethyl group); alkoxy groups (e.g., $C_{1-6}$ alkoxy groups such as a methoxy group and an ethoxy group), cycloalkyloxy groups (e.g., $C_{5-8}$ cycloalkyloxy groups such as a cyclohexyloxy group), aryloxy groups (e.g., $C_{6-10}$ aryloxy groups such as a phenoxy group), and aralkyloxy groups (e.g., $C_{6-10}$ aryl-$C_{1-4}$ alkyloxy groups such as a benzyloxy group); halogen atoms (e.g., a fluorine atom, a chlorine atom, a bromine atom, and an iodine atom); a nitro group; and a cyano group.

Preferred examples of the group $R^3$ include alkyl groups ($C_{1-6}$ alkyl groups, preferably $C_{1-4}$ alkyl groups, particularly, a methyl group), alkoxy groups ($C_{1-4}$ alkoxy groups, etc.), cycloalkyl groups ($C_{5-8}$ cycloalkyl groups), and aryl groups ($C_{6-12}$ aryl groups such as a phenyl group).

The number q of substitutions may be, for example, 0 to 4 (e.g., 0 to 3) and is preferably 0 to 2 (e.g., 0 or 1).

In the general formula (2), examples of the $C_{2-6}$ alkylene group represented by the group $R^4$ include, but are not particularly limited to, linear or branched $C_{2-6}$ alkylene groups such as an ethylene group, a propylene group (1,2-propanediyl group), a trimethylene group, a 1,2-butanediyl group, and a tetramethylene group, preferably $C_{2-4}$ alkylene groups, further preferably $C_{2-3}$ alkylene groups.

The number (number of moles of addition) r of oxyalkylene groups ($OR^4$) can be 1 or larger and may be, for example, 1 to 12 (e.g., 1 to 8), preferably 1 to 5 (e.g., 1 to 4), further preferably 1 to 3 (e.g., 1 or 2), particularly, 1.

Representative examples of the diol component (A) include 9,9-bis(hydroxy (poly)alkoxyphenyl) fluorenes and 9,9-bis(hydroxy (poly)alkoxynaphthyl) fluorenes.

Examples of the 9,9-bis(hydroxy (poly)alkoxyphenyl) fluorenes include: (i) 9,9-bis(hydroxy-$C_{2-4}$ alkoxyphenyl) fluorene such as 9,9-bis [4-(2-hydroxyethoxy)phenyl]fluorene and 9,9-bis [4-(2-hydroxypropoxy)phenyl]fluorene; (ii) 9,9-bis(hydroxy-$C_{2-4}$ alkoxy-mono- or di-$C_{1-4}$ alkylphenyl) fluorene such as 9,9-bis [4-(2-hydroxyethoxy)-3-methylphenyl]fluorene, 9,9-bis(4-(2-hydroxyethoxy)-3-isopropylphenyl) fluorene, 9,9-bis(4-(2-hydroxyethoxy)-3-isobutylphenyl) fluorene, 9,9-bis(4-(2-hydroxyethoxy)-3-t-butylphenyl) fluorene, 9,9-bis [4-(2-hydroxyethoxy)-3,5-dimethylphenyl] fluorene, and 9,9-bis(4-(2-hydroxyethoxy)-3-t-butyl-5-methylphenyl) fluorene; (iii) 9,9-bis(hydroxy-$C_{2-4}$ alkoxy-$C_{5-10}$ cycloalkylphenyl) fluorene such as 9,9-bis(4-(2-hydroxyethoxy)-3-cyclohexylphenyl) fluorene; (iv) 9,9-bis (hydroxy-$C_{2-4}$ alkoxy-$C_{6-10}$ arylphenyl) fluorene such as 9,9-bis [4-(2-hydroxyethoxy)-3-phenylphenyl]fluorene and 9,9-bis [4-(2-hydroxypropoxy)-3-phenylphenyl]fluorene; and compounds in which r in the compounds (ii) to (iv) is 2 to 5, for example, 9,9-bis(hydroxy-$C_{2-4}$ alkoxy-$C_{2-4}$ alkoxyphenyl) fluorene, 9,9-bis(hydroxy-$C_{2-4}$ alkoxy-$C_{2-4}$ alkoxy-mono- or di-$C_{1-4}$ alkylphenyl) fluorene, and 9,9-bis(hydroxy-$C_{2-4}$ alkoxy-$C_{2-4}$ alkoxy-$C_{6-10}$ arylphenyl) fluorene.

Examples of the 9,9-bis(hydroxy (poly)alkoxynaphthyl) fluorenes include: 9,9-bis(hydroxyalkoxynaphthyl) fluorene [e.g., 9,9-bis(hydroxy-$C_{2-4}$ alkoxynaphthyl) fluorene such as 9,9-bis [6-(2-hydroxyethoxy)-2-naphthyl]fluorene, 9,9-bis [5-(2-hydroxyethoxy)-1-naphthyl]fluorene, and 9,9-bis [6-(2-hydroxypropoxy)-2-naphthyl]fluorene]; and compounds in which r is 2 to 5, for example, 9,9-bis(hydroxy-$C_{2-4}$ alkoxy-$C_{2-4}$ alkoxynaphthyl) fluorene.

These diol components (A) can each be used singly, or two or more thereof can be used in combination. The diol component (A) can be particularly preferably 9,9-bis [4-(2-hydroxyethoxy)phenyl]fluorene of the general formula (2) wherein Z is a phenylene group, each of p and q is 0, $R^4$ is an ethylene group, and r is 1.

In one aspect, the ratio of the diol component (A) used, though depending on the type or ratio of the dicarboxylic acid component used, is preferably 0 to 80% by mol, more preferably 0 to 50% by mol, further preferably 0 to 20% by mol, based on all diol components. When the ratio of the diol component (A) is 0% by mol or more, a glass transition temperature tends to be more improved. When the ratio of the diol component (A) is 80% by mol or less, there is a tendency to more improve moldability into a film, to decrease a photoelastic coefficient, and to enhance a property of exerting a phase difference.

2.3.1.3.2. Diol Component (B)

The Diol Component (B) which is a Monomer that May constitute the fluorene polyester can be represented by the following general formula (3):

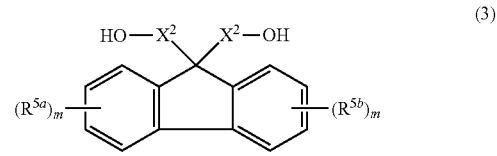

wherein $R^{5a}$ and $R^{5b}$ each independently represent a substituent inert to reaction, each m independently represents an integer of 0 to 4, and each $X^2$ independently represents a $C_{1-8}$ alkylene group.

In the general formula (3), the groups $R^{5a}$ and $R^{5b}$ and m are the same as $R^{2a}$ and $R^{2b}$ and p described in the general formula (2), also including preferred forms. $X^2$ is the same as $X^1$ described in the general formula (1), also including preferred forms.

Representative examples of the compound represented by the general formula (3) include 9,9-bis(hydroxymethyl) fluorene, 9,9-bis(2-hydroxyethyl) fluorene, and 9,9-bis(hydroxy-$C_{3-6}$ alkyl) fluorene. These diol components (B) may each be used singly, or two or more thereof may be combined. The diol component (B) is preferably 9,9-bis(hydroxymethyl) fluorene.

In one aspect, the ratio of the diol component (B) used, though depending on the type or ratio of the dicarboxylic acid component used, is preferably 0 to 80% by mol, more preferably 0 to 50% by mol, further preferably 0 to 20% by mol, based on all diol components. When the ratio of the diol component (B) falls within the range described above, a property of exerting a negative phase difference tends to be more improved.

2.3.1.3.3. Diol Component (C)

The diol component (C) which is a monomer that may constitute the fluorene polyester can be represented by the following general formula (4):

wherein $X^3$ represents a $C_{2-8}$ alkylene group.

Examples of the diol component (C) can include, but are not particularly limited to, linear or branched alkanediol ($C_{2-8}$ alkanediol such as ethylene glycol, 1,2-propanediol, 1,3-propanediol, 1,2-butanediol, 1,3-butanediol, 1,4-butanediol, 1,3-pentanediol, 1,4-pentanediol, 1,5-pentanediol, neopentyl glycol, and 1,6-hexanediol, preferably $C_{2-6}$ alkanediol, further preferably $C_{2-4}$ alkanediol), and polyalkanediol (e.g., di- or tri-$C_{2-4}$ alkanediol such as diethylene glycol, dipropylene glycol, and triethylene glycol). These diol components (C) may each be used singly, or two or more thereof may be combined.

Among them, the diol component (C) is preferably ethylene glycol of the general formula (4) wherein $X^3$ is an ethylene group. By use of such a diol component (C), drawability tends to be more improved.

In one aspect, the ratio of the diol component (C) used, though depending on the type or ratio of the dicarboxylic acid component used, can be selected from a range, for example, on the order of 10% by mol or more (e.g., 30 to 100% by mol) based on all diol components and may be, for example, on the order of 50% by mol or more (e.g., 60 to 99% by mol), preferably 70% by mol or more (e.g., 80 to 98% by mol), further preferably 90% by mol or more (e.g., 95 to 97% by mol), particularly, 100% by mol, i.e., the diol components may be substantially constituted by only the diol component (C).

In another aspect, the ratio of the diol component (C) used is preferably 5 to 50% by mol, more preferably 5 to 35% by mol, further preferably 15 to 25% by mol, based on all diol components.

By use of the diol component (C) at the ratio as described above, though depending on the type or ratio of the dicarboxylic acid component used, the flexibility of the retardation film tends to be more improved.

2.3.1.4. Method for Producing Fluorene Polyester

The fluorene polyester resin A can be prepared through reaction of the dicarboxylic acid component with the diol component. Such a method for producing the fluorene polyester is not particularly limited, and the fluorene polyester may be prepared by a common method, a transesterification method, a melt polymerization method such as a direct polymerization method, a solution polymerization method, or an interfacial polymerization method. In the polymerization reaction, a transesterification catalyst, a polycondensation catalyst, a heat stabilizer, a light stabilizer, a polymerization modifier, or the like may be used.

Examples of the transesterification catalyst include, but are not particularly limited to, compounds (alkoxide, organic acid salt, inorganic acid salt, metal oxide, etc.) of alkaline earth metals (magnesium, calcium, barium, etc.) or transition metals (manganese, zinc, cobalt, titanium, etc.). Among them, manganese acetate, calcium acetate, or the like can be suitably used.

Examples of the type of the polycondensation catalyst can include, but are not particularly limited to, compounds of the alkaline earth metals, the transition metals, group 13 metals of the periodic table (aluminum, etc.), group 14 metals of the periodic table (germanium, etc.), or group 15 metals of the periodic table (antimony, etc.), more specifically, germanium compounds such as germanium dioxide, germanium hydroxide, germanium oxalate, germanium tetraethoxide, and germanium n-butoxide, antimony compounds such as antimony trioxide, antimony acetate, and antimony ethylene glycolate, and titanium compounds such as tetra-n-propyl titanate, tetraisopropyl titanate, tetra-n-butyl titanate, titanium oxalate, and titanium potassium oxalate. These catalysts may each be used singly, or two or more types thereof may be used as a mixture.

Examples of the heat stabilizer can include, but are not particularly limited to, phosphorus compounds such as trimethyl phosphate, triethyl phosphate, triphenyl phosphate, phosphorus acid, trimethyl phosphite, and triethyl phosphite.

In the reaction, the ratios of the dicarboxylic acid component and the diol component used can be selected from the same ranges as above. If necessary, a predetermined component may be used in excess. For example, a diol component, such as ethylene glycol, capable of being distilled off from the reaction system may be used in excess over the ratio of the unit to be introduced in the fluorene polyester. The reaction may be performed in the presence or absence of a solvent.

The reaction can be performed in an inert gas (nitrogen, helium, etc.) atmosphere. The reaction can also be performed under reduced pressure (e.g., on the order of $1\times10^2$ to $1\times10^4$ Pa). The reaction temperature depends on a polymerization method, and the reaction temperature in a melt polymerization method, for example, may be on the order of 150 to 300° C., preferably 180 to 290° C., further preferably 200 to 280° C.

2.3.2. Fluorene Polycarbonate

The resin A preferably comprises a polycarbonate resin comprising at least one diol component selected from the group consisting of a diol component (A) represented by the general formula (2) and a diol component (B) represented by the general formula (3) mentioned above, and an arbitrary dicarbonate component. By comprising such a polycarbonate resin, the resulting resin has negative intrinsic birefringence, and a property of exerting a negative phase difference tends to be more improved.

Examples of the dicarbonate component include, but are not particularly limited to, dialkyl carbonate, diaryl carbonate, and alkylene carbonate.

A method for producing the fluorene polycarbonate is not particularly limited as long as the method is conventionally known. The fluorene polycarbonate can be prepared, for example, through the transesterification reaction of the diol component with the dicarbonate component in the presence of a transesterification catalyst.

2.4. Other Additives

The first resin layer may comprise, if necessary, with various additives. Examples of the additives include plasticizers, flame retardants, stabilizers, antistatic agents, fillers, foaming agents, antifoaming agents, lubricants, mold release agents, and slipping agents. These additives may each be used singly, or two or more thereof may be used in combination.

Examples of the plasticizers include esters, phthalic acid compounds, epoxy compounds, and sulfonamides. Examples of the flame retardants include inorganic flame retardants, organic flame retardants, and colloidal flame retardant substances.

Examples of the stabilizers include antioxidants, ultraviolet absorbers, and heat stabilizers. Examples of the fillers include oxide-based inorganic fillers, non-oxide-based inorganic fillers, and metal powders.

Examples of the mold release agents include natural waxes, synthetic waxes, linear fatty acids and metal salts thereof, and acid amides.

Examples of the slipping agents include: inorganic fine particles such as silica, titanium oxide, calcium carbonate, clay, mica, and kaolin; and organic fine particles such as (meth)acrylic resins and styrene resins (cross-linked polystyrene resins, etc.).

The ratio of such an additive is, for example, 30 parts by mass or less, preferably 0.1 to 20 parts by mass, further preferably 1 to 10 parts by mass, per 100 parts by mass of the resin A.

3. Second Resin Layer

The second resin layer is a layer having positive intrinsic birefringence. The second resin layer comprises resin B and may optionally comprise other additives mentioned later.

3.1. Physical Properties

In the second resin layer, in-plane phase difference Ro(450) at an angle of incidence of 0° for light at a wavelength of 450 nm, in-plane phase difference Ro(550) at an angle of incidence of 0° for light at a wavelength of 550 nm, and in-plane phase difference Ro(650) at an angle of incidence of 0° for light at a wavelength of 650 nm meet Ro(450)>Ro(550)>Ro(650).

The in-plane phase difference Ro(450 nm) of the second resin layer is preferably 150 to 1000 nm, more preferably 200 to 800 nm, further preferably 240 to 600 nm.

The in-plane phase difference Ro(550 nm) of the second resin layer is preferably 150 to 1000 nm, more preferably 200 to 800 nm, further preferably 230 to 600 nm.

The in-plane phase difference Ro(550 nm) per μm in thickness of the second resin layer is preferably 10 to 50 nm, more preferably 10 to 45 nm, further preferably 10 to 40 nm.

The in-plane phase difference Ro(650 nm) of the second resin layer is preferably 150 to 1000 nm, more preferably 200 to 800 nm, further preferably 230 to 600 nm.

The phase difference Rth(550 nm) in a thickness direction of the second resin layer is preferably 100 to 800 nm, more preferably 125 to 600 nm, further preferably 150 to 400 nm.

The phase difference Rth(550 nm) in a thickness direction per μm in thickness of the second resin layer is preferably 5 to 30 nm, more preferably 7 to 25 nm, further preferably 10 to 20 nm.

3.2. Thickness

The thickness of the second resin layer is preferably 1 to 40 μm, more preferably 2 to 30 μm, further preferably 3 to 20μ m.

3.3. Resin B

The resin B is not particularly limited as long as the resulting second resin layer has the optical physical properties described above. Examples thereof include polycarbonate resins, polyamide resins, polyvinyl alcohol resins, cellulose ester resins such as triacetylcellulose films and cellulose acetate propionate films, polyester resins such as polyethylene terephthalate and polyethylene naphthalate, polyarylate resins, polyimide resins, cycloolefin resins, polysulfone resins, polyethersulfone resins, and polyolefin resins such as polyethylene and polypropylene.

Among them, particularly, a polycarbonate resin or a polyamide resin is more preferred, and a polyamide resin is further preferred, because of excellent drawability. The polycarbonate resin is excellent in film formability and adhesion to the first resin layer, and the polyamide resin is excellent in chemical resistance. Therefore, a wide range of solvents can be used for coating the second resin layer with the first resin layer comprising the resin A.

The resin B is preferably a resin containing no aromatic ring in its backbone. If an aromatic ring is contained in the backbone, the aromatic ring in the backbone is oriented in parallel with the film surface upon drawing so that the value of nz with respect to nx and ny tends to be small. Thus, the characteristics of interest are difficult to obtain.

4. Layer Configuration

The retardation film of the present embodiment is not particularly limited as long as the retardation film has the first resin layer comprising the resin A having negative intrinsic birefringence, and the second resin layer comprising the resin B having positive intrinsic birefringence. The retardation film of the present embodiment may have an additional layer.

Examples of the layer configuration of the retardation film include, but are not particularly limited to: a 2-layer laminate consisting of the first resin layer and the second resin layer; a 3-layer laminate having the first resin layers on both surfaces and having the second resin layer therebetween; a 3-layer laminate having the second resin layers on both surfaces and having the first resin layer therebetween; and a 3-layer or more multilayer laminate having the first resin layer, the second resin layer, and an additional layer.

Examples of the additional layer include release films. Examples of such a release film that can be used include, but are not particularly limited to, known films such as polyethylene terephthalate, polybutylene terephthalate, polyethylene naphthalate, polyethylene films, polypropylene films, cellophane, diacetylcellulose films, triacetylcellulose films, acetylcellulose butyrate films, polyvinyl chloride films, polyvinylidene chloride films, polyvinyl alcohol films, ethylene-vinyl acetate copolymer films, polystyrene films, polymethylpentene films, polysulfone films, polyether ether ketone films, polyethersulfone films, polyetherimide films, polyimide films, fluorine resin films, and nylon films. Among them, polyethylene terephthalate or a triacetylcellulose film is preferred.

The retardation film of the present embodiment may be a 1/4λ retardation film having a function of converting linearly polarized light to circularly polarized light, or converting circularly polarized light to linearly polarized light. The 1/4λ retardation film is a retardation film that exhibits in-plane phase difference Ro(λ) at a predetermined wavelength of λ nm=λ/4 (or an odd multiple thereof). The retardation film of the present embodiment can be prepared as a 1/4λ retardation film appropriate for a purpose by controlling not only a chemical structure but drawing conditions such as a drawing temperature and a drawing rate, or a film thickness to be obtained after drawing, etc.

The 1/4λ retardation film may be used as a circularly polarizing plate by lamination with a polarizer. The circularly polarizing plate is disposed on the visible side of an organic EL display apparatus and used for suppressing reduction in contrast caused by outside light reflection. The organic EL display apparatus has the circularly polarizing plate and an organic EL panel consisting of an organic EL device. In the organic EL display apparatus, a polarizer, the retardation film, and a metal electrode, etc. of an organic EL panel are located in order from the visible side.

The relationship between light incident from the visible side and the display apparatus will be described. Outside light incident from the visible side is converted to linearly polarized light by a polarizer through which only light polarized in a specific direction passes, and then converted to circularly polarized light by the retardation film. The circularly polarized light converted from the incident light reaches a metal electrode, etc. of an organic EL panel and is reflected by the metal electrode, etc. having a property of reflecting light. By this reflection, the incident light is converted to reflected light having an inverted circularly polarized light state. Then, the reflected light having an inverted circularly polarized light state repasses through the retardation film and is converted to reflected light of linearly polarized light inclined 90° with respect to that at the time of incidence. The reflected light of linearly polarized light inclined 90° reaches a polarizer through which only light of 0° passes, and is thereby absorbed to the polarizer so that penetration to the visible side is blocked. Owing to this series of steps, outside light incident from the visible side can no longer penetrate to the visible side even if reflected by the metal electrode, etc. of the organic EL panel. By this action, the display apparatus can keep a contrast high from the visible side without reflecting outside light.

The outside light incident from the visible side is generally supposed to have light at any wavelength in visible light region λ=400 to 780 nm. The retardation film can perform optical compensation with higher accuracy by controlling a predetermined phase difference against the entire visible light region. For example, in a 1/4λ retardation film, phase difference λ/4 (nm) in the entire visible light region is reportedly ideal for the retardation film.

In this context, the wavelength dispersibility refers to the relationship between a wavelength and a phase difference. A property of increasing an absolute value of the phase difference with increase in wavelength is called reverse wavelength dispersibility. On the contrary, a property of decreasing an absolute value of the phase difference with increase in wavelength is called forward wavelength dispersibility. For example, a property of attaining phase difference λ/4 (nm) in the entire visible light region allows the retardation film to have reverse wavelength dispersibility in the entire visible light region.

[Method for Producing Retardation Film]

The method for producing a retardation film according to the present embodiment is not particularly limited and comprises, for example, a drawing step of drawing an undrawn laminate to obtain a drawn laminate, the undrawn laminate having a first undrawn resin layer comprising resin A having negative intrinsic birefringence, and a second undrawn resin layer comprising resin B having positive intrinsic birefringence, and may further comprise a lamination step of forming the undrawn laminate before the drawing step. Hereinafter, each step will be described in detail.

1. Lamination Step

The lamination step is the step of forming an undrawn laminate having a first undrawn resin layer comprising resin A having negative intrinsic birefringence, and a second undrawn resin layer comprising resin B having positive intrinsic birefringence. Examples of the method for forming the undrawn laminate include, but are not particularly limited to, coextrusion molding methods, coating molding methods, and extrusion lamination molding methods.

The first undrawn resin layer and the second undrawn resin layer are drawn in the drawing step mentioned later so that the resins in the layers are oriented to form a first resin layer and a second resin layer.

In the coextrusion molding method, for example, a composition comprising the resin A and a composition comprising the resin B are individually melt-extruded using an extruder, combined in a feed block, and coextrusion-molded into a film using a T die. As a result, an undrawn laminate comprising the first undrawn resin layer laminated with the second undrawn resin layer can be obtained.

In the coating molding method, the first undrawn resin layer is coated with a coating liquid containing the resin B, and the solvent is volatilized by drying to form the second undrawn resin layer, or second undrawn resin layer is coated with a coating liquid containing the resin A, and the solvent is volatilized by drying to form the first undrawn resin layer. As a result, an undrawn laminate comprising the first undrawn resin layer laminated with the second undrawn resin layer can be obtained.

In the extrusion lamination molding method, the first undrawn resin layer and the second undrawn resin layer are separately formed, and these layers are sandwiched between rolls and thereby molded into a multilayer film. As a result, an undrawn laminate comprising the first undrawn resin layer laminated with the second undrawn resin layer can be obtained.

Examples of the film formation method for each of the first undrawn resin layer and the second undrawn resin layer include, but are not particularly limited to, casting methods (or solution casting methods), extrusion methods (melt extrusion methods such as inflation methods and T die methods), and calendering methods. Among them, a melt extrusion method such as a T die method is preferred from the viewpoint that not only is productivity excellent but reduction in optical characteristics caused by a residual solvent can be prevented.

Each of the thicknesses of the first undrawn resin layer and the second undrawn resin layer is preferably 1 to 40 μm, more preferably 2 to 30 μm, further preferably 3 to 20 μm, still further preferably 3 to 10 μm.

Among them, the coextrusion molding method is preferred from the viewpoint of production efficiency and from the viewpoint of inhibiting a volatile component such as a solvent from remaining in the film. However, the coextrusion molding method may be limited by a resin that can be used, from the viewpoint of interfacial adhesive property between the first undrawn resin layer and the second undrawn resin layer. The coating molding method is preferred from the viewpoint of the suppression of resin deterioration, a uniform film thickness, and the removal of foreign matter. However, the coating molding method may be limited by a solvent that can be used, due to the solubility of a resin.

Examples of the coextrusion T die method which is a coextrusion molding method include feed block methods and multi-manifold methods. A multi-manifold method is particularly preferred because variation in thickness of each layer can be reduced. In the case of producing a laminated film using the coextrusion molding method, the melting temperature of a resin to be extruded is preferably Tg+80° C. or higher, more preferably Tg+100° C. or higher, and preferably Tg+180° C. or lower, more preferably Tg+150° C. or lower. This melting temperature, for example, in the coextrusion T die method, refers to the melting temperature of a resin in an extruder having a T die. When the melting temperature of the resin to be extruded is equal to or higher than the lower limit value of the range described above, the fluidity of the resin can be sufficiently enhanced and moldability can thus be favorable. When the melting temperature is equal to or lower than the upper limit value, the deterioration of the resin can be suppressed.

In the coextrusion molding method, a melted resin in a film form extruded from a die slip is usually cooled and cured by adhesion to a cooling roll. In this respect, examples of the method for allowing the melted resin to adhere to a cooling roll include air knife methods, vacuum box methods, and electrostatic adhesion methods.

In the coating molding method, surface roughening treatment by a sandblast method, a solvent treatment method, or the like, or surface oxidation treatment, for example, corona discharge treatment, chromic acid treatment, flame treatment, hot-air treatment, ozone/ultraviolet irradiation treatment, or electron beam irradiation treatment, may be carried out for the purpose of improving the adhesion between the first undrawn resin layer and the second undrawn resin layer.

Examples of the solvent constituting the coating liquid containing the resin A or B in the coating molding method include, but are not particularly limited to: aromatic solvents such as benzene, toluene, and xylene; ketone-based solvents such as diacetone alcohol, acetone, cyclohexanone, cyclopentanone, methyl ethyl ketone, and methyl isopropyl ketone; cycloalkane-based solvents such as cyclohexane, ethylcyclohexane, and 1,2-dimethylcyclohexane; halogen-containing solvents such as methylene chloride and chloroform; and ether-based solvents such as tetrahydrofuran and dioxane. One type of solvent may be used singly, or two or more types of solvents may be used in combination at an arbitrary ratio.

The concentration of the resin in a coating liquid is preferably 1% by mass to 50% by mass from the viewpoint of obtaining a viscosity suitable for coating.

Examples of the coating method using the coating liquid include, but are not particularly limited to, curtain coating methods, extrusion coating methods, roll coating methods, spin coating methods, dip coating methods, bar coating methods, spray coating methods, slide coating methods, printing coating methods, gravure coating methods, die coating methods, gap coating methods, and dipping methods.

Examples of the method for drying the coating liquid include, but are not particularly limited to, drying methods such as drying by heating and drying under reduced pressure.

2. Drawing Step

The drawing step is the step of drawing an undrawn laminate to obtain a drawn laminate, the undrawn laminate having a first undrawn resin layer comprising resin A having negative intrinsic birefringence, and a second undrawn resin layer comprising resin B having positive intrinsic birefringence. The drawn laminate may be used directly as the retardation film or may be further subjected to other steps and then used as the retardation film. Examples of the drawing method include, but are not particularly limited to, uniaxial drawing methods and biaxial drawing methods.

2.1. Uniaxial Drawing Method

The uniaxial drawing method may be fixed-end uniaxial drawing or free-end uniaxial drawing. Among them, fixed-end uniaxial drawing is preferred because there is less neck-in and physical property values are easily adjusted. The direction of drawing in the uniaxial drawing method may be any drawing of the undrawn laminate in a longitudinal direction, in a width direction, or in a direction of 45°±15° with respect to a width direction. Among them, oblique drawing which draws the undrawn laminate in a direction of 45°±15° with respect to a width direction is preferred. In this context, the width direction refers to the shorter side direction of a long undrawn laminate, and the longitudinal direction refers to the longer side direction of a long undrawn laminate.

In general, a circularly polarizing plate comprising a laminate of a polarizer and a retardation film is often designed such that a direction in which the polarizer absorbs light is oblique to a direction in which the retardation film causes a phase difference in the light. This polarizer is often produced so as to have the direction of light absorption in a longitudinal direction. When the direction in which the retardation film causes a phase difference in the light is a longitudinal or a width direction, the retardation film must be cut in an oblique direction for the lamination of the polarizer and the retardation film.

However, if the retardation film is cut in an oblique direction, many end parts of the retardation film are generated and become an enormous loss in large-scale production.

Accordingly, the retardation film for use as a portion of a circularly polarizing plate is drawn in a direction of 45°±15° with respect to a width direction and allowed to exert a phase difference in this direction. As a result, a loss of end parts in the lamination step with the polarizer can be drastically reduced. This also permits continuous production of a long retardation film to be drawn in an oblique direction, and therefore markedly improves productivity.

Particularly, the retardation film of the present embodiment has a high property of exerting a phase difference and is thin. Therefore, the retardation film of the present embodiment requires a lower cost than that of a retardation film or the like having the liquid crystal layer mentioned above, and is capable of reducing a production cost through continuous production by oblique drawing, as compared with liquid crystals which require many steps.

A drawing approach is not particularly limited and may be a common method such as an inter-roll drawing method, a heating roll drawing method, a compression drawing method, or a tenter drawing method.

In the case of uniaxial drawing, the drawing temperature also differs depending on the desired phase difference and is, for example, (Tg−10) to (Tg+20° C.), preferably (Tg−5) to (Tg+10° C.), more preferably (Tg−3) to (Tg+5° C.), further preferably (Tg+2) to (Tg+5° C.) Specifically, the temperature is, for example, 100 to 150° C., preferably 110 to 145° C., more preferably 120 to 140° C., further preferably 129 to 133° C. When the drawing temperature falls within the range mentioned above, not only is the desired phase difference more easily exerted, but the film can be more uniformly drawn and can be more prevented from being broken.

In the case of uniaxial drawing, the draw ratio also differs depending on the desired phase difference and is, for example, 1.1 to 5 times, preferably 1.3 to 3.5 times, more preferably 1.5 to 2.5 times. When the draw ratio is equal to or more than the lower limit value described above, the desired phase difference is more easily obtained. When the draw ratio is equal to or less than the upper limit value described above, elevation in phase difference and break of the film can be more suppressed. The retardation film of the present embodiment is difficult to break because of favorable drawability, and, albeit being a thin film, produces the desired phase difference because of a high property of exerting a phase difference.

In the case of uniaxial drawing, the drawing rate may be, for example, on the order of 1 to 100 mm/min, preferably 20 to 80 mm/min, further preferably 50 to 70 mm/min. When the drawing rate is equal to or more than the lower limit value described above, the desired phase difference is more easily obtained.

2.2. Biaxial Drawing Method

The biaxial drawing method may be any of sequential biaxial drawing and simultaneous biaxial drawing. In the sequential biaxial drawing, longitudinal drawing is usually performed by inter-roll drawing, followed by transverse drawing by tenter drawing. The inter-roll drawing causes neck-in and has a disadvantage such as the transfer of a scratch by contact with a roll. On the other hand, the simultaneous biaxial drawing has a disadvantage such as neck-in between clips at both ends of the film. The simultaneous biaxial drawing is preferred for a smaller in-plane phase difference. In the biaxial drawing method, the undrawn laminate is drawn in a longitudinal direction and in a width direction.

In the case of biaxial drawing, the drawing temperature is, for example, (Tg−10) to (Tg+20° C.), preferably (Tg−5) to (Tg+10° C.), more preferably (Tg−3) to (Tg+5° C.), further preferably (Tg+2) to (Tg+5° C.) Specifically, the temperature is, for example, 100 to 150° C., preferably 110 to 145° C., more preferably 120 to 140° C., further preferably 129 to 133° C. When the drawing temperature falls within the range mentioned above, not only is the desired phase difference more easily exerted, but the film can be more uniformly drawn and can be more prevented from being broken.

In the case of biaxial drawing, the draw ratio also differs depending on the desired phase difference and is preferably equal times longitudinally and transversely for a small in-plane phase difference. The draw ratio may be, for example, on the order of 1.1 to 5×1.1 to 5 times, preferably 1.3 to 3.5×1.3 to 3.5 times, further preferably 1.5 to 2.5×1.5 to 2.5 times. When the draw ratio is equal to or more than the lower limit value described above, the desired phase difference is easily obtained. When the draw ratio is equal to or less than the upper limit value described above, elevation in phase difference and break of the film can be more suppressed. The retardation film of the present embodiment is difficult to break because of favorable drawability and toughness, and, albeit being a thin film, produces the desired phase difference because of a high property of exerting a phase difference.

In the case of biaxial drawing, the drawing rate may be equal rates longitudinally and transversely for a small in-plane phase difference. The drawing rate is, for example, 1 to 100 mm/min, preferably 20 to 80 mm/min, further preferably 50 to 70 mm/min. When the drawing rate is equal to or more than the lower limit value described above, the resulting film tends to have a larger phase difference. When the drawing rate is equal to or less than the upper limit value described above, break of the film tends to be more suppressed. The retardation film of the present embodiment is difficult to break because of favorable drawability and toughness, and, albeit being a thin film, produces the desired phase difference because of a high property of exerting a phase difference.

The retardation film may be laminated, if necessary, with an additional film (or a coating layer) without impairing the advantageous effects of the present invention. For example, the surface of the retardation film may be coated with a polymer layer containing a surfactant, a mold release agent, or fine particles to form a slipping layer.

2.3. Drawing Apparatus for Retardation Film

The drawing apparatus for a retardation film of the present embodiment comprises: a pair of guide rails disposed on both terminal sides in a width direction of the undrawn laminate; grippers which move along the guide rails while gripping end parts in a width direction of the undrawn laminate so that the undrawn laminate is drawn in the width direction or in a longitudinal direction to prepare a retardation film; and a control unit which controls the grippers.

FIG. 2 shows a perspective view illustrating a portion of the drawing apparatus for a retardation film of the present embodiment. In FIG. 2, drawing apparatus 200 has guide rails 210, a plurality of grippers 220 which move along the guide rails 210, and undrawn laminate roll 230. Undrawn laminate 240 is sent in longitudinal direction D2 from the undrawn laminate roll 230 while both ends in width direction D1 of the undrawn laminate are sequentially gripped by the grippers 220. The grippers 220 with the undrawn laminate 240 gripped move in the direction D2 along the guide rails 210 curved outwardly in the width direction so that the undrawn laminate 240 is drawn in the width direction D1.

In the drawing apparatus for a retardation film of the present embodiment, in addition to this, the undrawn laminate 240 may be drawn in the longitudinal direction D2 by applying tension to the undrawn laminate 240 in the longitudinal direction. In this case, the tension may be applied in the longitudinal direction D2 by winding the drawn laminate on a downstream side in the longitudinal direction.

Although not shown in FIG. 2, oblique drawing which draws the undrawn laminate in a direction of 45°±15° with respect to a width direction may be carried out instead of drawing in width direction D1, depending on the shape of the guide rails 210. Specifically, in FIG. 2, the undrawn laminate 240 is sent and wound in the same direction. By contrast, oblique drawing can be carried out by using guide rails configured such that one end part in a width direction of the undrawn laminate is conveyed ahead of the other end part so as to cross the directions of sending and winding.

Control unit 250 controls the speed and the like of the grippers 220 which move along the guide rails 210, and controls the grippers 220 to prepare a retardation film having the predetermined physical properties, etc. More specifically, the control unit controls the movement of the grippers and thereby controls the grippers such that in the resulting retardation film, a Nz coefficient is −1.0 to 1.0, and in-plane phase difference Ro(450) at an angle of incidence of 0° for light at a wavelength of 450 nm, in-plane phase difference Ro(550) at an angle of incidence of 0° for light at a wavelength of 550 nm, and in-plane phase difference Ro(650) at an angle of incidence of 0° for light at a wavelength of 650 nm meet Ro(450)<Ro(550)<Ro(650).

[Retardation Film Manufacturing System]

The retardation film manufacturing system of the present embodiment comprises: a lamination unit which prepares an undrawn laminate having a first undrawn resin layer comprising resin A having negative intrinsic birefringence, and a second undrawn resin layer comprising resin B having positive intrinsic birefringence; and the drawing apparatus.

1. Lamination Unit

The lamination unit is not particularly limited as long as the lamination units prepare the undrawn laminate. Examples thereof can include units which carry out the coextrusion molding method, the coating molding method, or the extrusion lamination molding method listed in the lamination step mentioned above.

In the coextrusion molding method, for example, an extrusion apparatus by which a composition comprising the resin A and a composition comprising the resin B are individually melt-extruded using an extruder, combined in a feed block, and coextrusion-molded into a film using a T die can be used as the lamination unit.

In the coating molding method, a coating unit which coats the first undrawn resin layer with a coating liquid containing the resin B, or coats the second undrawn resin layer with a coating liquid containing the resin A, and a drying unit which dries the coating liquid used in the coating can be used as the lamination unit.

In the extrusion lamination molding method, a lamination apparatus having rolls for laminating the first undrawn resin layer and the second undrawn resin layer formed separately can be used as the lamination unit.

2. Drawing Apparatus

The drawing apparatus mentioned above can be used as the drawing apparatus.

[Production System]

The production system of the present embodiment comprises a polarizing plate manufacturing line having any one or more steps selected from the step of applying a pressure-sensitive adhesive layer or an adhesive layer to the retardation film, the step of laminating the pressure-sensitive adhesive layer or the adhesive layer with a polarizer, and the step of irradiating the pressure-sensitive adhesive layer or the adhesive layer with heat or active energy ray.

[Polarizing Plate]

Next, the polarizing plate of the present embodiment will be described with reference to FIGS. 3A and 4B. This polarizing plate comprises the retardation film described above. Each of FIGS. 3A and 4B is a cross-sectional view schematically illustrating one form of the polarizing plate. Hereinafter, an example having adhesive layer 21 will be described, while the adhesive layer may be read as a pressure-sensitive adhesive layer.

Polarizing plate 20 shown in FIG. 3A is a laminate of retardation film 10, polarizer 22, and polarizer protective film 24. As shown in this drawing, adhesive layer 21 may be disposed between the retardation film 10 and the polarizer 22, and adhesive layer 23 may be disposed between the polarizer 22 and the polarizer protective film 24.

Polarizing plate 30 shown in FIG. 3B is a laminate of retardation film 10, polarizer protective film 32, polarizer 34, and polarizer protective film 36. Adhesive layer 31 may be disposed between the retardation film 10 and the polarizer protective film 32, and adhesive layer 33 or 35 may be disposed between the polarizer 34 and the polarizer protective film 32 or 36.

The retardation film 10 may be subjected to corona treatment, plasma treatment, or surface modification treatment with an aqueous solution of a strong base such as sodium hydroxide or potassium hydroxide in order to improve adhesion to the polarizer 22. Such adhesive layer formation or surface modification treatment may be performed after a film formation step or may be performed after a drawing step.

The polarizer 22 is not particularly limited as long as the polarizer is a conventionally known one. Examples thereof include: films obtained by subjecting hydrophilic polymer films such as polyvinyl alcohol films, partially formalized polyvinyl alcohol films, or ethylene-vinyl acetate copolymer-based partially saponified films to staining treatment with iodine or a dichroic substance such as a dichroic dye and drawing treatment; and polyene-based oriented films such as dehydration treatment products of polyvinyl alcohol and dehydrochlorination treatment products of polyvinyl chloride. Other examples thereof include polarizers obtained by staining polyvinyl alcohol films with iodine, followed by uniaxial drawing.

The polarizer protective film 24 is not particularly limited as long as the material has a high adhesive property to the polarizer 22 and is optically transparent. Examples thereof include cellulose ester-based films such as triacetylcellulose films and cellulose acetate propionate films, modified acrylic resin-based films, ultrahigh-birefringence polyethylene terephthalate resin-based films, and cycloolefin-based films.

The polarizing plate of the present embodiment may further comprise a 1/4λ retardation film on the visible side of the retardation film. Such a configuration of the retardation film of the present embodiment further laminated with the 1/4λ retardation film can circularly polarize light from a backlight of an organic EL display apparatus or a liquid crystal display apparatus (hereinafter, referred to as a "light emission side").

In general, for example, a polarizing plate that linearly polarizes light is present on the visible side of a display apparatus. When a viewer wears sunglasses, so-called blackout may arise which is a problem in which no visible contact is attained if the sunglasses are orthogonal to the polarization direction of the polarizing plate. In order to avoid this problem, light from the light emission side is applied to pass through the polarizing plate so as to become linearly polarized light, which is then allowed to pass through the 1/4λ retardation film having a circular polarization function. The light with which the viewer has visible contact thereby becomes circularly polarized light so that blackout can be prevented. Such a function is also called sunglass readability.

The 1/4λ retardation film to be laminated on the visible side of the retardation film is provided, as described above, for the purpose of avoiding blackout by circularly polarizing light from the light emission side, aside from a 1/4λ retardation film aimed at having a function of circularly polarizing incident light and reflected light in order to allow a polarizing plate to absorb reflected light in an organic EL display apparatus.

As described above, the 1/4λ retardation film has a plurality of different functions. Therefore, in order to avoid confusion, the 1/4λ retardation film aimed at having a function of circularly polarizing incident light and reflected light in order to allow a polarizing plate to absorb reflected light in an organic EL display apparatus may be referred to as a "first 1/4λ retardation film", and the 1/4λ retardation film aimed at having a function of avoiding blackout by circularly polarizing light from the light emission side may be referred to as a "second 1/4λ retardation film".

[Image Display Apparatus]

Next, the image display apparatus of the present embodiment will be described with reference to FIGS. 4A and 5B. The image display apparatus of the present embodiment is not particularly limited as long as the image display apparatus comprises the polarizing plate. Examples thereof include organic electroluminescence (EL) display apparatuses and liquid crystal display apparatuses. The image display apparatus is not only an apparatus that is distributed as a final product in itself to the market but may be a portion of an information processing apparatus mentioned later, for example, a smartphone. FIG. 4A is a cross-sectional view schematically illustrating an organic EL display apparatus according to one aspect of the present embodiment. FIG. 4B is a cross-sectional view schematically illustrating a liquid crystal display apparatus according to one aspect of the present embodiment.

As shown in FIG. 4A, organic EL display apparatus 40 has organic EL display panel 41, polarizing plate 20 comprising the retardation film 10 of the present embodiment, and front panel 43 in this order. In the organic EL display apparatus 40, use of polarizing plate 20 having a 1/4λ retardation film suppresses outside light reflection so that less colored black can be expressed.

The organic EL display apparatus 40 may optionally have an additional configuration such as touch sensor 42. The organic EL display apparatus 40 equipped with the touch sensor 42 functions as an information input interface, in addition to a function as a display apparatus. The respective layers constituting the organic EL display apparatus 40 may be joined to each other using a pressure-sensitive adhesive or a pressure-sensitive adhesive.

As shown in FIG. 4B, liquid crystal display apparatus 50 has light source 51, polarizing plate 30, liquid crystal panel 52, polarizing plate 30, and front panel 53 in this order. The light source 51 may be a direct-lit system in which light sources are evenly arranged immediately beneath the liquid crystal panel, or may be an edge-lit system having a reflector and a light guide panel. Although FIG. 4B shows the front panel 53, the liquid crystal display apparatus 50 may have no front panel 53. The liquid crystal display apparatus 50 may further have a touch sensor (not shown).

The screen of the image display apparatus is not limited by a rectangular shape and may have a round, oval, or polygonal (e.g., triangular or pentagonal) shape. The image display apparatus can further have flexibility, and its shape may be changed such that the image display apparatus is arched, bent, wound, or folded. For example, as shown in FIG. 5, the image display apparatus includes a rollable display that can be used such that a roll of image display apparatus 61 housed in image display apparatus housing 62 is taken out.

[Information Processing Apparatus]

Next, the information processing apparatus of the present embodiment will be described with reference to FIG. 6. This drawing is a perspective view schematically showing information processing apparatus 60 of the present embodiment. The information processing apparatus 60 comprises the image display apparatus having the polarizing plate. The information processing apparatus 60 is a smartphone having image display apparatus 61. The image display apparatus 61 can adopt, for example, the configuration of the organic EL display apparatus 40 or the liquid crystal display apparatus 50 mentioned above.

Examples of such information processing apparatus 60 include smartphones as well as, but are not particularly limited to, various apparatuses capable of processing information, such as personal computers and tablet terminals. The thinness of the polarizing plate of the present embodiment is exploited, particularly, for a personal computer, a smartphone, a tablet terminal, or the like desired to be thinned or miniaturized. The reverse wavelength dispersibility of the polarizing plate of the present embodiment is more exploited for a personal computer, a smartphone, a tablet terminal, or the like that is carried to various locations such as outdoors or indoors and used.

Further examples of the information processing apparatus 60 include terminals such as a foldable smartphone that has refrangible image display apparatus 61 and can be folded (FIG. 7), and a rollable smartphone that can be used such that a roll of image display apparatus 61 housed therein is taken out (FIG. 8).

The image display apparatus 61 may also have a function as an input or output interface of the information processing apparatus and may have a function as an output interface which outputs various processing results of the information processing apparatus, or an input interface, such as a touch panel, which performs operation for the information processing apparatus. Other configurations of the information processing apparatus are not particularly limited, and the information processing apparatus can typically have a processor, a communication interface that controls wired or wireless communication, an input or output interface other than the image display apparatus, a memory, a storage, and one or more communication buses for mutually connecting these components.

EXAMPLES

Hereinafter, the present invention will be described in more detail with reference to Examples. However, the present invention is not limited by these Examples. Evaluation methods and starting materials will be given below.
[Evaluation Method]
(Glass Transition Temperature (Tg))

A differential scanning calorimeter ("DSC 6220" manufactured by Seiko Instruments Inc.) was used. A sample was placed in an aluminum pan, and Tg was measured in the range of 30° C. to 200° C. in accordance with JIS K 7121.
(Molecular Weight)

Gel permeation chromatography (manufactured by Tosoh Corp., "HLC-8120GPC") was used. A sample was dissolved in chloroform, and polystyrene-based weight-average molecular weight Mw was measured.
(Ro, Rth, and Nz Coefficient)

A retardation measurement apparatus ("RETS-100" manufactured by Otsuka Electronics Co., Ltd.) was used. Ro(450), Ro(550), Ro(650), Rth(550), nx, ny, and nz of a drawn film were measured at a measurement temperature of 20° C. A Nz coefficient was calculated according to the following expression (1).

$$(nx - nz)/(nx - ny) \tag{1}$$

(Average Thickness)

A thickness gauge ("Micrometer" manufactured by Mitsutoyo Corp.) was used. Three equally spaced points between chucks were measured in the longitudinal direction of a film, and an average value thereof was calculated.
[Starting Material]

Synthesis Example 1: FDPm: 9,9-bis(2-methoxycarbonylethyl)fluorene [dimethyl ester of 9,9-bis(2-carboxyethyl)fluorene (or fluorene-9,9-dipropionic acid)]

200 mL of 1,4-dioxane and 33.2 g (0.2 mol) of fluorene were placed in a reactor, and the fluorene was dissolved by stirring. Then, 3.0 mL of a solution containing 40% by weight of trimethylbenzylammonium hydroxide in methanol ("Triton B40" manufactured by Tokyo Chemical Industry Co., Ltd.) was added dropwise thereto in a state cooled to 10° C., and the mixture was stirred for 30 minutes. Next, 37.9 g (0.44 mol) of methyl acrylate was added thereto, and the mixture was stirred for approximately 3 hours. After the completion of the reaction, the reaction mixture was washed by the addition of 200 mL of toluene and 50 mL of 0.5 N hydrochloric acid. The aqueous layer was removed, and the organic layer was then washed three times with 30 mL of distilled water. The solvent was distilled off to obtain 84.0 g of 9,9-bis(methyl propionate) fluorene [9,9-bis {2-(methoxycarbonyl)ethyl}fluorene] (yield: 99%). The compound was further dissolved in 300 mL of isopropyl alcohol of 70° C. and then recrystallized by cooling to 10° C. to obtain 9,9-bis(2-methoxycarbonylethyl) fluorene.

Synthesis Example 2: DNFDP-m: 9,9-bis(2-methoxycarbonylethyl)2,7-di(2-naphthyl)fluorene A reactor was charged with 192.3 g (0.39 mol) of 2,7-dibromofluorene, 200 g (1.2 mol) of 2-naphthylboronic acid, 4.3 L of dimethoxyethane, and 1 L of a 2 M aqueous sodium carbonate solution. Under a stream of nitrogen, 22.4 g (19.4 mmol) of tetrakis(triphenylphosphine) palladium(0) [or Pd(PPh$_3$)$_4$] was added thereto, and the mixture was reacted by heating to reflux at an internal temperature of 71 to 78° C. for 5 hours. After cooling to room temperature, 2.0 L of toluene and 500 mL of ion-exchange water were added thereto, followed by liquid-liquid extraction five times and washing. The color of the organic layer was changed from dark orange to brown. Insoluble matter was filtered off, and the filtrate was concentrated to obtain 305 g of brown crude crystals. The obtained crude crystals were dissolved by heating in a mixed solution of 1.5 kg of ethyl acetate and 300 g of isopropyl alcohol (IPA). Then, the solution was cooled to 10° C. or lower with ice water and stirred for 1 hour to deposit crystals. The deposited crystals were collected by filtration and then dried under reduced pressure to obtain 130 g of gray-brown crystals. The obtained gray-brown crystals were purified by column chromatography (silica gel support, developing solvent: chloroform:ethyl acetate (volume ratio)=4:1), then recrystallized with methanol, and dried under reduced pressure to obtain 116 g of 9,9-bis(2- methoxycarbonylethyl) 2,7-di(2-naphthyl) fluorene (DNFDP-m) (white crystals, yield: 54.9%, HPLC purity: 99.4 area %).

Abbreviations in the description below each represent the following.
- BPEF: 9,9-bis [4-(2-hydroxyethoxy)phenyl]fluorene, manufactured by Osaka Gas Chemicals Co., Ltd.
- EG: ethylene glycol
- PA-1: polyamide, TROGAMID CX7323, manufactured by Daicel-Evonik Ltd.
- PA-2: polyamide, RILSAN CLEAR G 120, manufactured by Arkema K.K.
- PS: polystyrene, PSJ-Polystyrene GPPS HF-77, manufactured by PS Japan Corp.

Production Example 1

To 0.65 mol of DNFDP-m, 0.35 of FDP-m, 0.3 mol of BPEF, and 2.70 mol of EG, $2\times10^{-4}$ mol of manganese acetate tetrahydrate and $8\times10^{-4}$ mol of calcium acetate monohydrate were added as a transesterification catalyst, and the mixture was gradually melted by heating with stirring. After temperature elevation to 230° C., $14\times10^{-4}$ mol of trimethyl phosphate and $20\times10^{-4}$ mol of germanium oxide were added thereto, and EG was removed by gradual temperature elevation and pressure reduction until reaching 270° C. and 0.13 kPa or lower. After reaching a predetermined stirring torque, the contents were isolated from the reactor to prepare polyester resin pellets.

As a result of analyzing the obtained pellets by 1H-NMR, 65% by mol and 35% by mol of dicarboxylic acid components introduced in the polyester resin were derived from DNFDP-m and FDP-m, respectively, and 30% by mol and 70% by mol of diol components introduced therein were derived from BPEF and EG, respectively. The obtained polyester resin had glass transition temperature Tg of 132° C. and weight-average molecular weight Mw of 90,000. This resin is referred to as PEs-1.

Production Example 2

A polyester resin was prepared by the same method as in Production Example 1 except that the starting materials were changed to 0.75 mol of DNFDP-m, 0.25 mol of FDP-m, 0.20 mol of BPEF, and 2.80 mol of EG. As a result of analyzing the obtained pellets by 1H-NMR, 75% by mol and 25% by mol of dicarboxylic acid components introduced in the polyester resin were derived from DNFDP-m and FDP-m, respectively, and 20% by mol and 80% by mol of diol components introduced therein were derived from BPEF and EG, respectively. The obtained polyester resin had glass transition temperature Tg of 127° C. and weight-average molecular weight Mw of 90,000. This resin is referred to as resin PEs-2.

Production Example 3

A polyester resin was prepared by the same method as in Production Example 1 except that the starting materials were changed to 1.00 mol of FDPm, 0.80 mol of BPEF, and 2.20 mol of EG. As a result of analyzing the obtained pellets by 1H-NMR, 100% by mol of dicarboxylic acid components introduced in the polyester resin were derived from FDP-m, and 80% by mol and 20% by mol of diol components introduced therein were derived from BPEF and EG, respectively. The obtained polyester resin had glass transition temperature Tg of 126° C. and weight-average molecular weight Mw of 43,600. This resin is referred to as resin PEs-3.

Production Example 4

$1.3\times10^{-6}$ mol of calcium acetate monohydrate was added as a transesterification catalyst to 0.70 mol of isosorbide (manufactured by Tokyo Chemical Industry Co., Ltd.), 0.30 mol of cyclohexanedimethanol (manufactured by Tokyo Chemical Industry Co., Ltd.), and 1.00 mol of diphenyl carbonate (manufactured by Tokyo Chemical Industry Co., Ltd.). After thorough purging with nitrogen, the oxygen concentration was adjusted to 0.0005 to 0.001% by volume. Subsequently, the mixture was warmed with a heat medium. Stirring was started when the internal temperature reached 100° C. The contents were melted until homogeneous while the internal temperature was controlled at 100° C. Then, temperature elevation was started, and the internal temperature was adjusted to 210° C. in 40 minutes. This temperature was controlled so as to be maintained when the internal temperature reached 210° C. Pressure reduction was started at the same time therewith, and the pressure was adjusted to 13.3 kPa in 90 minutes after the temperature reached 210° C. The mixture was further held for 60 minutes while this pressure was maintained.

Phenol steam produced as a by-product through polymerization reaction was directed to a reflux condenser using, as a cooling medium, steam controlled to 100° C. in terms of an inlet temperature of the reflux condenser. A dihydroxy compound or carbonic acid diester contained in a slight amount in the phenol steam is returned to the polymerization reactor, and uncondensed phenol steam was subsequently directed to a condenser using warm water of 45° C. as a cooling medium, and recovered. The contents thus oligomerized were temporarily repressurized into atmospheric pressure and transferred to another polymerization reaction apparatus having a stirring blade and a reflux condenser controlled in the same manner as above. Temperature elevation and pressure reduction were started to attain an internal temperature of 220° C. and a pressure of 200 Pa in 60 minutes.

Then, an internal temperature of 230° C. and a pressure of 0.13 kPa or lower were attained over 20 minutes. After reaching a predetermined stirring torque, the contents were isolated from the reactor to prepare carbonate copolymer resin pellets. This resin is referred to as resin PC.

Examples 1 to 9 and Comparative Examples 1 and 2

(Film Formation Step)

The resin pellets serving as a material for the second resin layer described in the table below were dried in hot air overnight at 180° C. and then extrusion-molded using a T die extrusion molding machine to form a film. The cylinder temperature was set to 280° C. The thickness of the film thus formed was controlled by adjusting the number of screw rotations of the extruder.

(Lamination Step)

The pellets of each resin serving as a material for the first resin layer described in Table 1 below were dissolved at a concentration of 30% in tetrahydrofuran. The film for the second resin layer obtained in the film formation step was coated with the solution using an applicator and dried at 80° C. for 8 hours to prepare an undrawn laminated film.

(Drawing Step)

Each undrawn laminated film thus obtained in the lamination step was subjected to free-end or fixed-end uniaxial drawing under the drawing conditions described in Table 1 using a tenter drawing apparatus. Various physical properties of the obtained drawn film were measured. The results are shown in Table 1.

INDUSTRIAL APPLICABILITY

The retardation film of the present invention is suitably used in an image display apparatus (e.g., a reflective liquid crystal display apparatus, a semi-transmissive liquid crystal display apparatus, and an organic EL display apparatus).

TABLE 1

|  |  | Example 1 | Example 2 | Example 3 | Example 4 | Example 5 | Example 6 |
|---|---|---|---|---|---|---|---|
| Drawing conditions | Drawing method | Fixed-end uniaxial | Fixed-end uniaxial | Fixed-end uniaxial | Fixed-end uniaxial | Fixed-end uniaxial | Free-end uniaxial |
|  | Drawing temperature [° C.] | 130 | 130 | 130 | 130 | 130 | 140 |
|  | Draw ratio | 2.5 | 2.5 | 2.5 | 2.5 | 2.5 | 2 |
| First resin layer | Material | PEs-1 | PEs-2 | PEs-3 | PEs-1 | PEs-1 | PEs-2 |
|  | Thickness after drawing/μm | 6 | 3 | 30 | 5 | 6 | 5 |
|  | Ro(450 nm) [nm] | 193 | 128 | 250 | 177 | 196 | 128 |
|  | Ro(550 nm) [nm] | 161 | 99 | 216 | 135 | 163 | 98 |
|  | Ro(550 nm) [nm]* | 26.8 | 33.0 | 7.2 | 27.0 | 27.2 | 19.6 |
|  | Ro(650 nm) [nm] | 142 | 89 | 201 | 122 | 144 | 89 |
|  | $R_{th}$(550 nm) [nm] | −160 | −89 | −167 | −146 | −162 | −52 |
|  | $R_{th}$(550 nm) [nm]* | −26.7 | −29.7 | −5.6 | −29.2 | −27.0 | −10.4 |
| Second resin layer | Material | PA-1 | PA-1 | PA-1 | PA-2 | PC | PA-1 |
|  | Thickness after drawing/μm | 13 | 11 | 16 | 16 | 23 | 9 |
|  | Ro(450 nm) [nm] | 306 | 241 | 363 | 290 | 309 | 241 |
|  | Ro(550 nm) [nm] | 299 | 237 | 354 | 273 | 301 | 236 |
|  | Ro(550 nm) [nm]* | 23.0 | 21.5 | 22.1 | 17.1 | 13.1 | 26.2 |
|  | Ro(650 nm) [nm] | 290 | 234 | 351 | 265 | 297 | 234 |
|  | $R_{th}$(550 nm) [nm] | 192 | 151 | 225 | 191 | 224 | 114 |
|  | $R_{th}$(550 nm) [nm]* | 14.8 | 13.7 | 14.1 | 11.9 | 9.7 | 12.7 |
| Laminate | Thickness after drawing/μm | 19 | 14 | 46 | 21 | 29 | 14 |
|  | Ro(450 nm) [nm] | 113 | 113 | 113 | 113 | 113 | 113 |
|  | Ro(550 nm) [nm] | 138 | 138 | 138 | 138 | 138 | 138 |
|  | Ro(650 nm) [nm] | 148 | 145 | 150 | 143 | 153 | 145 |
|  | Nz coefficient | 0.72 | 0.94 | 0.91 | 0.83 | 0.95 | 0.95 |

|  |  | Example 7 | Example 8 | Example 9 | Comparative Example 1 | Comparative Example 2 |
|---|---|---|---|---|---|---|
| Drawing conditions | Drawing method | Fixed-end uniaxial | Fixed-end uniaxial | Fixed-end uniaxial | Fixed-end uniaxial | Fixed-end uniaxial |
|  | Drawing temperature [° C.] | 130 | 130 | 130 | 135 | 135 |
|  | Draw ratio | 2.5 | 2.5 | 2.5 | 2.5 | 2.5 |
| First resin layer | Material | PEs-1 | PEs-1 | PEs-1 | PS | PEs-2 |
|  | Thickness after drawing/μm | 9 | 12 | 16 | 10 | 7 |
|  | Ro(450 nm) [nm] | 299 | 392 | 532 | 8 | 123 |
|  | Ro(550 nm) [nm] | 249 | 327 | 443 | 7 | 95 |
|  | Ro(550 nm) [nm]* | 27.7 | 27.3 | 27.7 | 0.7 | 13.6 |
|  | Ro(650 nm) [nm] | 220 | 289 | 392 | 6 | 85 |
|  | $R_{th}$(550 nm) [nm] | −247 | −325 | −441 | −6 | −71 |
|  | $R_{th}$(550 nm) [nm]* | −27.4 | −27.1 | −27.6 | −0.6 | −10.1 |
| Second resin layer | Material | PA-1 | PA-1 | PA-1 | PA-1 | PA-1 |
|  | Thickness after drawing/μm | 16 | 20 | 25 | 6 | 11 |
|  | Ro(450 nm) [nm] | 396 | 476 | 595 | 148 | 236 |
|  | Ro(550 nm) [nm] | 387 | 465 | 581 | 145 | 233 |
|  | Ro(550 nm) [nm]* | 24.2 | 23.3 | 23.2 | 24.2 | 21.2 |
|  | Ro(650 nm) [nm] | 376 | 451 | 564 | 143 | 230 |
|  | $R_{th}$(550 nm) [nm] | 247 | 298 | 372 | 88 | 144 |
|  | $R_{th}$(550 nm) [nm]* | 15.4 | 14.9 | 14.9 | 14.7 | 13.1 |
| Laminate | Thickness after drawing/μm | 25 | 32 | 41 | 16 | 18 |
|  | Ro(450 nm) [nm] | 97 | 84 | 63 | 140 | 113 |
|  | Ro(550 nm) [nm] | 138 | 138 | 138 | 138 | 138 |
|  | Ro(650 nm) [nm] | 156 | 162 | 172 | 137 | 145 |
|  | Nz coefficient | 0.50 | 0.30 | 0.00 | 1.09 | 1.03 |

*Value per μm thickness

As is evident from Table 1, a laminated film made of the first resin layer having negative intrinsic birefringence and the second resin layer having positive intrinsic birefringence was found to be excellent in wavelength dispersibility and Nz coefficient and to produce a 1/4λ retardation film, by drawing under suitable conditions.

REFERENCE SIGNS LIST

10 . . . retardation film, 11 . . . first resin layer, 12 . . . second resin layer, 20 and 30 . . . polarizing plate, 21, 23, 31, 33, and 35 . . . adhesive layer, 22 and 34 . . . polarizer, 24, 32, and 36 . . . polarizer protective film, 40 . . . organic EL display apparatus, 41 . . . organic EL display panel, 42 . . .

touch sensor, 43 . . . front panel, 50 . . . liquid crystal display apparatus, 51 . . . light source, 52 . . . liquid crystal panel, 53 . . . front panel, 60 . . . information processing apparatus, 61 . . . image display apparatus, 62 . . . image display apparatus housing, 200 . . . drawing apparatus, 210 . . . guide rail, 220 . . . gripper, 230 . . . undrawn laminate roll, 240 . . . undrawn laminate, 250 . . . control unit.

The invention claimed is:

1. A retardation film comprising:
    a first resin layer comprising resin A having negative intrinsic birefringence, wherein in-plane phase difference Ro (450) at an angle of incidence of 0° for light at a wavelength of 450 nm, in-plane phase difference Ro (550) at an angle of incidence of 0° for light at a wavelength of 550 nm, and in-plane phase difference Ro (650) at an angle of incidence of 0° for light at a wavelength of 650 nm meet Ro (450)>Ro (550)>Ro (650); and
    a second resin layer comprising resin B having positive intrinsic birefringence, wherein in-plane phase difference Ro (450) at an angle of incidence of 0° for light at a wavelength of 450 nm, in-plane phase difference Ro (550) at an angle of incidence of 0° for light at a wavelength of 550 nm, and in-plane phase difference Ro (650) at an angle of incidence of 0° for light at a wavelength of 650 nm meet Ro (450)>Ro (550)>Ro (650),
    the retardation film having a Nz coefficient of −1.0 to 1.0, wherein
    in-plane phase difference Ro (450) at an angle of incidence of 0° for light at a wavelength of 450 nm, in-plane phase difference Ro (550) at an angle of incidence of 0° for light at a wavelength of 550 nm, and in-plane phase difference Ro (650) at an angle of incidence of 0° for light at a wavelength of 650 nm meet Ro (450)<Ro (550)<Ro (650),
    in-plane phase difference Ro (550) per µm in thickness of the first resin layer is 5 to 50 nm,
    phase difference Rth (550) in a thickness direction per µm in thickness of the first resin layer is −50 to −3 nm,
    in-plane phase difference Ro (550) per µm in thickness of the second resin layer is 10 to 50 nm,
    phase difference Rth (550) in a thickness direction per µm in thickness of the second resin layer is 5 to 30 nm, and
    the resin A comprises a structural unit having an arylated fluorene backbone and the resin B comprises a polyamide resin.

2. The retardation film according to claim 1, wherein the resin A comprises fluorene polyester comprising a dicarboxylic acid component represented by the following general formula (1) and at least one diol component selected from the group consisting of a diol component (A) represented by the following general formula (2), a diol component (B) represented by the following general formula (3), and a diol component (C) represented by the following general formula (4):

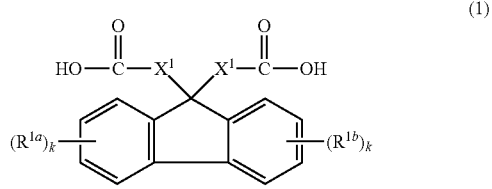

(1)

wherein $R^{1a}$ and $R^{1b}$ each independently represent a phenyl group or a naphthyl group, each k independently represents an integer of 0 to 4, and each $X^1$ independently represents a $C_{1-8}$ alkylene group,

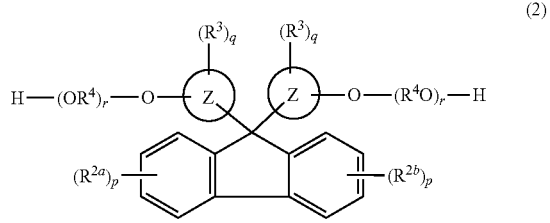

(2)

wherein each Z independently represents a phenylene group or a naphthylene group, $R^{2a}$ and $R^{2b}$ each independently represent a substituent inert to reaction, each p independently represents an integer of 0 to 4, each $R^3$ independently represents an alkyl group, an alkoxy group, a cycloalkyloxy group, an aryloxy group, an aralkyloxy group, an aryl group, a cycloalkyl group, an aralkyl group, a halogen atom, a nitro group, or a cyano group, each q independently represents an integer of 0 to 2, each $R^4$ independently represents a $C_{2-6}$ alkylene group, and each r independently represents an integer of 1 or larger,

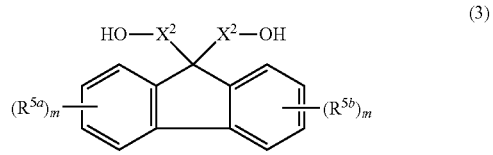

(3)

wherein $R^{5a}$ and $R^{5b}$ each independently represent a substituent inert to reaction, each m independently represents an integer of 0 to 4, and each $X^2$ independently represents a $C_{1-8}$ alkylene group,

HO—$X^3$—OH (4)

wherein $X^3$ represents a $C_{2-8}$ alkylene group.

3. The retardation film according to claim 1, wherein the retardation film is a 1/4λ retardation film.

4. A polarizing plate comprising the retardation film according to claim 1.

5. An image display apparatus comprising the polarizing plate according to claim 4.

6. An information processing apparatus comprising the image display apparatus according to claim 5.

7. A method for producing the retardation film according to claim 1, comprising
    a drawing step of drawing an undrawn laminate to obtain a drawn laminate, the undrawn laminate having a first undrawn resin layer comprising resin A having negative intrinsic birefringence, and a second undrawn resin layer comprising resin B having positive intrinsic birefringence.

8. The method for producing a retardation film according to claim 7, wherein
    in the drawing step, the undrawn laminate is drawn in a direction of 45°±15° with respect to a width direction.

9. A production system comprising
    a polarizing plate manufacturing line having any one or more steps selected from the step of applying a pressure-sensitive adhesive layer or an adhesive layer to the retardation film according to claim 1, the step of laminating the pressure-sensitive adhesive layer or the adhesive layer with a polarizer, and the step of irradiating the pressure-sensitive adhesive layer or the adhesive layer with heat or active energy ray.

\* \* \* \* \*